(12) United States Patent
Tanada et al.

(10) Patent No.: US 7,078,322 B2
(45) Date of Patent: Jul. 18, 2006

(54) METHOD OF MANUFACTURING A THIN FILM TRANSISTOR

(75) Inventors: Yoshifumi Tanada, Kanagawa (JP); Kazuya Nakajima, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 10/305,007

(22) Filed: Nov. 27, 2002

(65) Prior Publication Data

US 2003/0166315 A1 Sep. 4, 2003

(30) Foreign Application Priority Data

Nov. 29, 2001 (JP) .................................. 2001-365302

(51) Int. Cl.
*H01L 21/20* (2006.01)

(52) U.S. Cl. ................ 438/487; 438/486; 438/166; 438/164; 438/795

(58) Field of Classification Search .......... 438/164, 438/166, 486, 487, 795, 150
See application file for complete search history.

(56) References Cited

U.S. PATENT DOCUMENTS

| | | | |
|---|---|---|---|
| 5,643,826 A | 7/1997 | Ohtani et al. | |
| 5,893,990 A | 4/1999 | Tanaka | |
| 6,071,765 A | 6/2000 | Noguchi et al. | |
| 6,156,997 A | 12/2000 | Yamazaki et al. | |
| 6,451,636 B1 | 9/2002 | Segawa et al. | |
| 6,504,174 B1 * | 1/2003 | Yamazaki et al. | 257/64 |
| 6,528,397 B1 * | 3/2003 | Taketomi et al. | 438/487 |
| 6,534,744 B1 | 3/2003 | Yamazaki et al. | |
| 6,740,938 B1 | 5/2004 | Tsunoda et al. | |
| 6,862,008 B1 | 3/2005 | Yamazaki et al. | |
| 2002/0149053 A1 | 10/2002 | Tsunoda et al. | |
| 2002/0175328 A1 | 11/2002 | Tsunoda et al. | |
| 2003/0030381 A1 | 2/2003 | Yamazaki et al. | |
| 2003/0132205 A1 | 7/2003 | Yamazaki et al. | |
| 2003/0164500 A1 | 9/2003 | Tsunoda et al. | |

FOREIGN PATENT DOCUMENTS

| | | |
|---|---|---|
| JP | 07-183540 | 7/1995 |
| JP | 08-213629 | 8/1996 |
| JP | 2002-359376 | 12/2002 |
| JP | 2003-023161 | 1/2003 |
| JP | 2003-058075 | 2/2003 |

OTHER PUBLICATIONS

Akito Hara et al., High Performance Poly–Si TFTs on a Glass by a Stable Scanning CW Laser Lateral Crystallization, IEDM 2001, pp. 747–750.

Akito Hara et al., Ultra–high Performance Poly–Si TFTs on a Glass by a Stable Scanning CW Laser Lateral Crystallization, AM–LCD 2001, pp. 227–230.

Tsutsui et al., "Electroluminescence in Organic Thin Films", Photochemical Processed in Organized Molecular Systems, 1991, pp. 437–450 (Elsevier Science Publishers, Tokyo, 1991).

(Continued)

*Primary Examiner*—Amir Zarabian
*Assistant Examiner*—Christy Novacek
(74) *Attorney, Agent, or Firm*—Jeffrey L. Costellia; Nixon Paebody, LLP

(57) ABSTRACT

A method of manufacturing a semiconductor device characterized by its high-speed operation and high reliability is provided in which a semiconductor layer crystallized by a CW laser is used for an active layer of a TFT. When a semiconductor layer is crystallized by a CW laser, one part is formed of large crystal grains whereas another part is formed of microcrystals due to the width-wise energy density distribution. The former exhibits excellent electric characteristics. The latter has poor electric characteristics because grain boundaries hinder movement of electric charges, and therefore causes inconveniences when used as an active layer of a transistor. Accordingly, circuits are arranged such that a semiconductor layer formed of large crystal grains is used for the active layer of every TFT.

71 Claims, 24 Drawing Sheets

OTHER PUBLICATIONS

M.A. Baldo et al., "Highly efficient phosphorescent emission from organic electroluminescent devices", Nature vol. 395, Sep. 10, 1998, pp. 151–154.

M.A. Baldo et al., "Very high–efficiency green organic light–emitting devices based on electrophosphorescence", Applied Physics Letters, vol. 75, No. 1, Jul. 5, 1999, pp. 4–6.

T. Tsutsui et al., "High Quantum Efficiency in Organic Light–Emitting Devices with Iridium–Complex as a Triplet Emissive Center", Japanese Journal of Applied Physics, vol. 38, Part 12B, Dec. 15, 1999, pp. L1502–L1504.

* cited by examiner

Fig.5B longitudinal direction of crystal grains = laser scanning direction

Fig.5C longitudinal direction of crystal grains = laser scanning direction

V=0

0<V≦d

0<F (V<0)

d<V

METHOD OF MANUFACTURING A THIN FILM TRANSISTOR

BACKGROUND OF THE INVENTION

1. Field of the Invention

The present invention relates to a method of manufacturing a semiconductor device that includes a laser beam irradiation step, and the present invention also relates to a semiconductor device manufactured thereby. Note that a semiconductor device described here includes an electro-optical device such as a liquid crystal display device or a light-emitting device, and an electronic device that includes the electro-optical device as a display portion.

2. Description of the Related Art

In recent years, an extensive study has been made on a technique in which an amorphous semiconductor film formed on an insulator, especially a glass substrate, is crystallized so that a crystalline semiconductor film is obtained. As the methods of crystallization such as a thermal annealing method using furnace annealing, a rapid thermal annealing method (RTA method), a laser annealing method and the like were examined. Anyone thereof or combining two or more methods thereof can be carried out for crystallization.

On the other hand, an active matrix display device using a thin film transistor (hereafter referred to as TFT) manufactured by forming a semiconductor thin film is widely adopted. Active matrix display devices using TFTs have several hundred thousand to several million pixels arranged in a matrix shape, and an image display is performed by controlling the electric charge of each pixel by using TFTs disposed in each pixel.

Recently, techniques that are used for simultaneously forming driver circuits by using TFTs in the periphery of a pixel portion in addition to pixel TFTs that comprise pixels have progressed. A crystalline semiconductor layer has extreme higher electric field effect mobility in comparison with an amorphous semiconductor layer, therefor, it is practicable for forming an active layer of TFT (hereafter simply referred to as active layer, the active layer includes a source region, a drain region, and a channel formation region) used for such circuits.

Generally, in order to crystallize an amorphous semiconductor in annealing furnace, a thermal treatment at 600° C. or more for 10 hours or more is required. Therefor, applicable material of substrates is limited to quartz that is capable of withstanding the heat treatment. However, the quartz substrate is expensive in price, and is difficult to be manufactured in a large area.

In order to improve the manufacturing efficiency, manufacturing the substrate in a large area, and mass production are unavoidable, it is expected that a substrate in which a length of one side exceeds 1 m will be also used in recent years.

On the other hand, a method of thermal crystallization by using metal elements disclosed in Japanese Patent Application Laid Open No. 7-183540 enable the crystallization temperature which was a conventional problem to be realized at a low temperature. The crystalline semiconductor film can be formed by this method in which a small amount of an element such as nickel, palladium and lead is added to an amorphous semiconductor film, then the amorphous semiconductor film is heated for four hours at 550° C.

Since the laser annealing method can deliver high energy only to the semiconductor film without substantially increasing the temperature in substrate by focusing the semiconductor layer, the laser annealing technology comes under spotlight by its appliance in a glass substrate with a low strain point as a matter of course, and a plastic substrate, etc.

An example of the laser annealing method is a method of forming pulse laser beam from an excimer laser or the like by an optical system such that it becomes a square spot of several cm or a linear shape of 100 mm or more in length on an irradiation surface, and relatively shifting an irradiation position of the laser beam with respect to the irradiation surface to conduct annealing. The "linear shape" described here means not a "line" in the strict sense but a rectangle or a prolate ellipsoid shape having a high aspect ratio. For example, the linear shape indicates a shape having an aspect ratio of 2 or more (preferably, 10 to 100), Note that the linear shape is used to obtain an energy density required for annealing an object sufficiently to be irradiated. Thus, if sufficient annealing is conducted for the object to be irradiated, it may be a rectangular shape, a tabletop shape or any other shapes.

The state is shown in FIG. 8. After an amorphous semiconductor layer is formed on a substrate 801, a linear laser 803 is scanned and crystallized in a direction of an arrow. At this time, a cross-sectional view in which a dotted line is shown by A–A' is shown in FIG. 8B. An insulation layer 811 is formed on the substrate 801 as a base layer, an amorphous semiconductor layer 813 is formed thereon. In addition, for the insulation layer 811, a single layer is illustrated in FIG. 8, but a structure without an insulation layer, or a structure of a laminate film having two or more layers also may be used.

Then, the linear laser 803 is scanned and irradiated on the substrate. At this time, in a region 812 irradiated by the linear laser, the amorphous semiconductor layer is in a state of molten, and after the passage of the irradiation region, the amorphous semiconductor layer is recrystallized. As described above, a crystalline semiconductor layer 815 is formed. However, a crystalline semiconductor film formed by subjecting an amorphous semiconductor film to laser annealing includes a collection of a plurality of crystal grains, and the position and size of the crystal grains are random. TFTs are formed on a glass substrate by patterning the crystalline semiconductor layer in an island shape for device separation. In this case, the position and size of crystal grains cannot be specified. In comparison with the inner of crystal grains, the interface of crystal grains has an infinite number of a recombination centers or a trapping centers caused by an amorphous structure, a crystal defect, and the like. If the carriers are trapped in trapping centers, potential at a grain boundary will be increased and become barriers to carriers, it is known that current transporting characteristics of carriers will be degraded caused by this. However, it is almost impossible to form a channel formation region by using a single crystal semiconductor film while avoiding the influence of a crystal boundary, although crystal properties of semiconductor film of channel formation region have a serious effect on the TFT characteristics.

There is a technique of irradiating a semiconductor layer with a CW (continuous wave) laser beam by running the beam in one direction to make a crystal grow continuously in the scanning direction and obtain a single crystal stretching long in the scanning direction. It is considered that this method can provide a TFT having almost no grain boundaries at least in its channel direction. However, in order to obtain excellent crystallinity, a region of an amorphous semiconductor layer that is irradiated with a laser has to be melted completely. For that reason, the laser irradiation region is converged into a rectangle or ellipse having a width of several hundreds μm to secure enough energy density and the surface of the irradiation object is scanned with laser light as shown in FIG. 1A to crystallize the entire surface thereof. As a result, crystal grains that are long in the scanning direction are formed to grow into a crystalline semiconductor layer as shown in FIG. 1B.

Here, attention is paid to the energy density in the laser irradiation width direction. When laser light is collected spot-like in a region, there is an energy density distribution starting from the center of the irradiation region toward the edges as in an example shown in FIG. 1C. Although the energy density distribution varies depending on the laser oscillation mode, a region low in energy density is generally incapable of providing an energy for melting a semiconductor layer sufficiently. This region of the semiconductor layer cannot grow large crystal grains and can only have microcrystals. Accordingly, in a semiconductor layer treated with a CW laser, a crystalline semiconductor layer A 112 where crystal grains grow into satisfactory large sizes and a crystalline semiconductor layer B 113 having microcrystals are formed for each scanned region (an irradiation region of when the CW laser scans one line) as shown in FIG. 1B.

In the semiconductor layer A, excellent electric characteristics are obtained as mentioned above. On the other hand, the semiconductor layer B has countless numbers of grain boundaries and therefore cannot provide satisfactory electric characteristics.

If the semiconductor layer as such is patterned and used to form TFTs, there is a large difference in electric characteristic between a TFT which includes the semiconductor layer B in its channel formation region and a TFT which doesn't. Therefore, it is difficult to manufacture a semiconductor device that operates satisfactorily from these TFTs despite many elements included in them which have excellent electric characteristics.

SUMMARY OF THE INVENTION

The present invention has been made in view of the above, and an object of the present invention is therefore to provide a method of manufacturing a highly reliable semiconductor device capable of operating at high speed by selecting regions of excellent electric characteristics from a semiconductor layer crystallized with a CW laser and efficiently using the selected regions alone to form TFTs.

As described above, crystallization through CW laser irradiation is achieved by scanning over a substrate sequentially in parallel lines and therefore crystalline semiconductor layers A of large crystal grains and crystalline semiconductor layers B of microcrystals lay side by side in parallel to the scanning direction.

When a semiconductor device is manufactured from TFTs, a driving circuit region has, in addition to a region where a semiconductor layer for forming a TFT is placed, a region in which a signal line and a power supply line are arranged. In this region, a semiconductor layer is removed by etching. Therefore, by selectively using only regions formed of crystalline semiconductor layers A out of alternately laid crystalline semiconductor layers A and B to place TFTs, it is possible to remove all regions formed of crystalline semiconductor layers B by etching and exclude them from the use as regions for forming TFTs.

Structures of the present invention will be described below.

The present invention is a method of manufacturing a thin film transistor, including:

forming an amorphous semiconductor film on a substrate;

running laser light that is collected to have an elliptical or rectangular shape relative to the substrate to irradiate the amorphous semiconductor film with the laser light and form a crystalline semiconductor film; and etching the crystalline semiconductor film to form an active layer, characterized in that the width of a region irradiated with the laser light is the sum of an effective irradiation region width D, a width d of a region on the left side of the effective irradiation region, and a width d of a region on the right side of the effective irradiation region, and that the crystalline semiconductor film used for the active layer is formed excluding a region within a distance L, which is expressed by:

$$n(D+2d)-d \leq L \leq n(D+2d)+d \text{ and } 0 \leq L \text{ ($n$ is an integer, } 0 \leq n\text{) when } V=0; \quad (1)$$

$$n(D+2d)-d-(n-1)V \leq L \leq n(D+2d)+d-nV \text{ and } 0 \leq L \text{ ($n$ is an integer, } 0 \leq n\text{) when } 0 V \leq d; \quad (2)$$

$$n(D+V)-V+d \leq L \leq n(D+V)+d \text{ and } 0 \leq L(n \text{ is an integer, } 0 \leq n) \text{ when } d<V; \quad (3)$$

and $$n(D+2d)-d+(n-1)F \leq L \leq n(D+2d)+d+nF \text{ and } 0 \leq L(n \text{ is an integer, } 0 \leq n) \quad (4)$$

when V<0, V being the overlap width of adjacent laser beams during laser light scanning, L being the distance from the origin in the direction perpendicular to the laser light scanning direction, the origin being one point in an upper end of an irradiation region on an irradiation object.

Further, the present invention is a method of manufacturing a thin film transistor, including:

forming an amorphous semiconductor film on a substrate;

subjecting the amorphous semiconductor film to heat treatment to form a first crystalline semiconductor film;

running laser light that is collected to have an elliptical or rectangular shape relative to the substrate to irradiate the first crystalline semiconductor film with the laser light and form a second crystalline semiconductor film; and etching the second crystalline semiconductor film to form an active layer, characterized in that the width of a region irradiated with the laser light is the sum of an effective irradiation region width D, a width d of a region on the left side of the effective irradiation region, and a width d of a region on the right side of the effective irradiation region, and that the crystalline semiconductor film used for the active layer is formed excluding a region within a distance L, which is expressed by:

$$n(D+2d)-d \leq L \leq n(D+2d)+d \text{ and } 0 \leq L(n \text{ is an integer, } 0 \leq n) \text{ when } V=0; \quad (1)$$

$$n(D+2d)-d-(n-1)V \leq L \leq n(D+2d)+d-nV \text{ and } 0 \leq L(n \text{ is an integer, } 0 \leq n) \text{ when } 0<V \leq d;" \quad (2)$$

$$n(D+V)-V+d \leq L \leq n(D+V)+d \text{ and } 0 \leq L(n \text{ is an integer, } 0 \leq n) \text{ when } d<V; \quad (3)$$

and $$n(D+2d)-d+(n-1)F \leq L \leq n(D+2d)+d+nF \text{ and } 0 \leq L(n \text{ is an integer, } 0 \leq n) \quad (4)$$

when V<0, V being the overlap width of adjacent laser beams during laser light scanning, L being the distance from the origin in the direction perpendicular to the laser light scanning direction, the origin being one point in an upper end of an irradiation region on an irradiation object.

At this time, a method of manufacturing a thin film transistor is characterized in that the laser light is emitted from one selected from the group consisting of a continuous wave solid-state laser, a continuous wave gas laser, and a continuous wave metal steam laser. As the solid-state laser, there may be employed a continuous wave YAG laser, a continuous wave $YVO_4$ laser, a continuous wave YLF laser, a continuous wave $YAlO_3$ laser, a continuous wave alexandrite laser, a continuous wave Ti:sapphire laser, or the like. As the gas laser, there may be employed a continuous wave excimer laser, a continuous wave Ar laser, a continuous wave Kr laser, a continuous wave $CO_2$ laser, or the like. As the metal steam laser, there may be employed a continuous wave helium cadmium laser, a continuous wave copper steam laser, a continuous wave gold steam laser, or the like.

BRIEF DESCRIPTION OF THE DRAWINGS

In the accompanying drawings:

FIGS. 5A to 5C are diagrams showing the relation between the direction in which crystal grains of a semiconductor layer crystallized by a CW laser extend and a channel formation region of a transistor;

DETAILED DESCRIPTION OF THE PREFERRED EMBODIMENTS

Figure 1A:
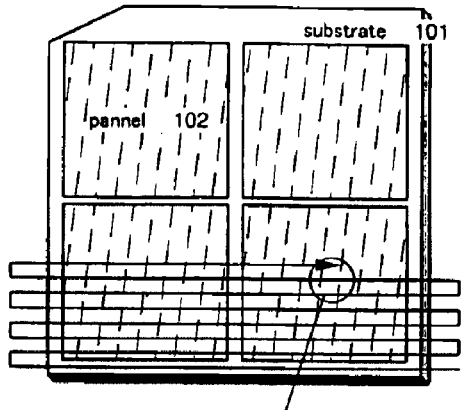
FIGS. 1A to 1C are diagrams showing a CW laser scanning the top face of a substrate and crystallizing a semiconductor film.
Figure 1B:
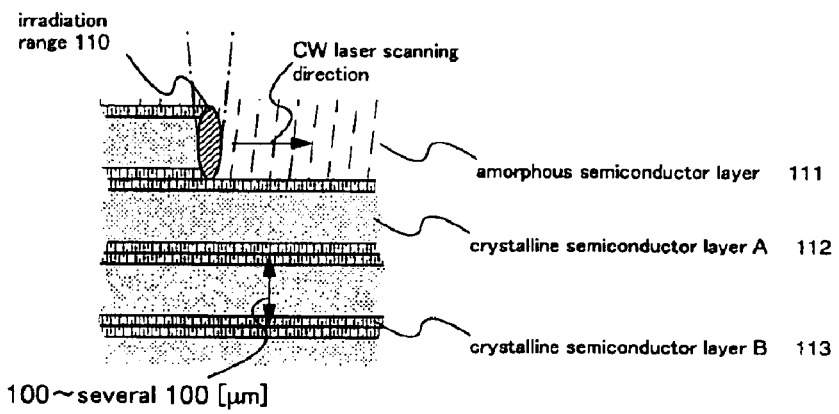
Figure 1C:
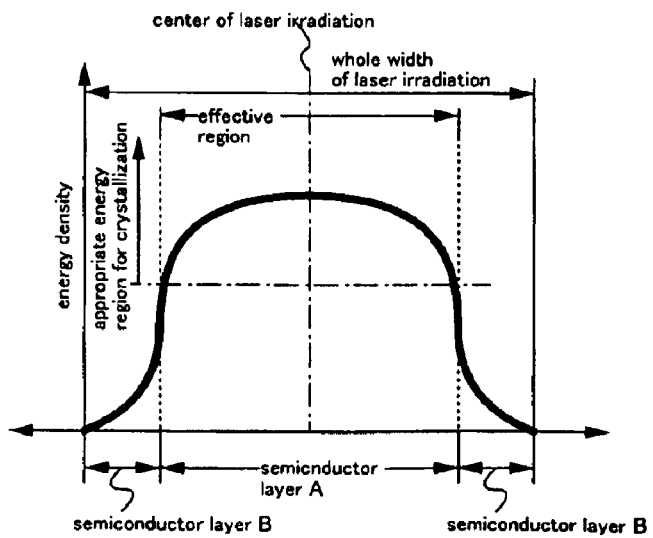
Figure 2A:
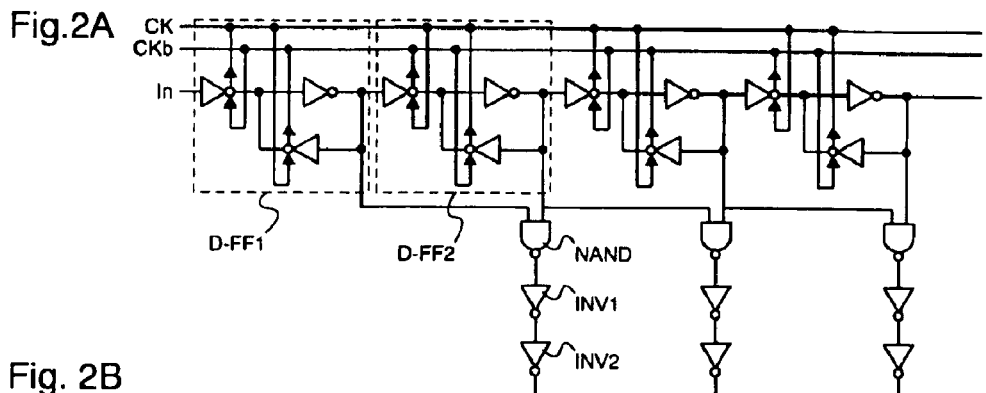
FIGS. 2A to 2C are a certain circuit diagram and diagrams showing examples of actual layout of the circuit.

An embodiment mode of the present invention is described with reference to FIGS. 2A to 2C. FIG. 2A is a circuit diagram showing a part of a driving circuit for driving a pixel portion of a display device. The circuit is composed of a shift register having plural stages of D-flip-flops (D-FF), NANDs, inverters (INVs), and the like, and sequentially outputs pulses in response to clock signals (CK and CKb) and start pulses (In).

Figure 2B:
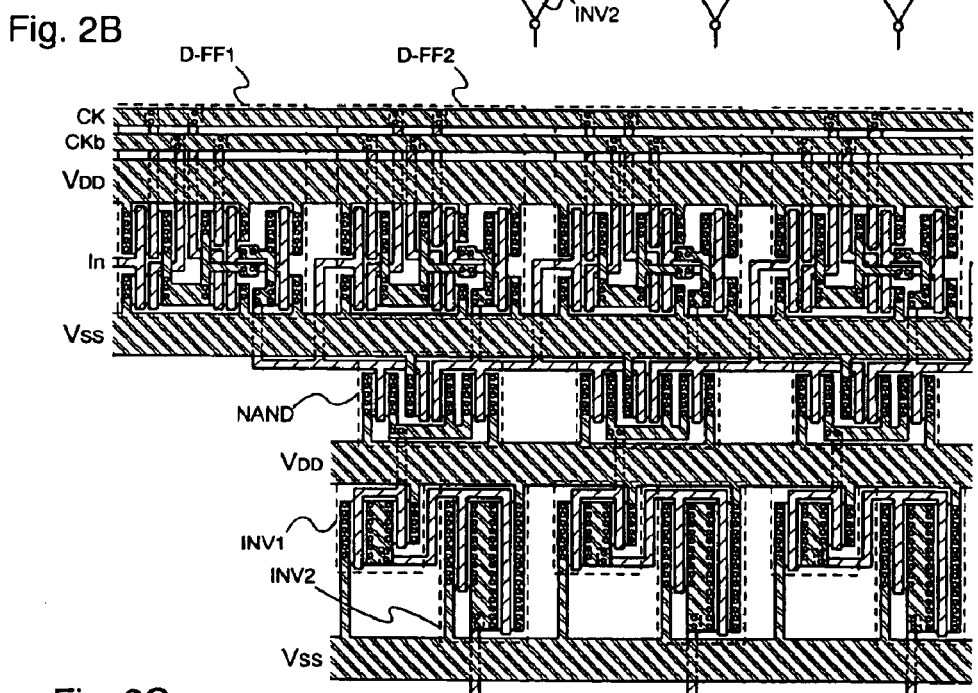

FIG. 2B shows an actual layout example in which elements and wires are arranged in accordance with the circuit diagram of FIG. 2A. Areas framed by dotted lines in FIG. 2B correspond to those of FIG. 2A. Signal lines to which clock signals are inputted (CK and CKb) and power supply lines (VDD and VSS) for providing the H level electric potential and the L level electric potential, and the like are arranged in parallel in the lateral direction as shown in FIG. 2B. This layout is characterized in that the line width is set large for the power supply lines to avoid voltage drop caused by wire resistance since the power supply lines are divided into plural stages to supply power to respective TFTs.

Figure 2C:
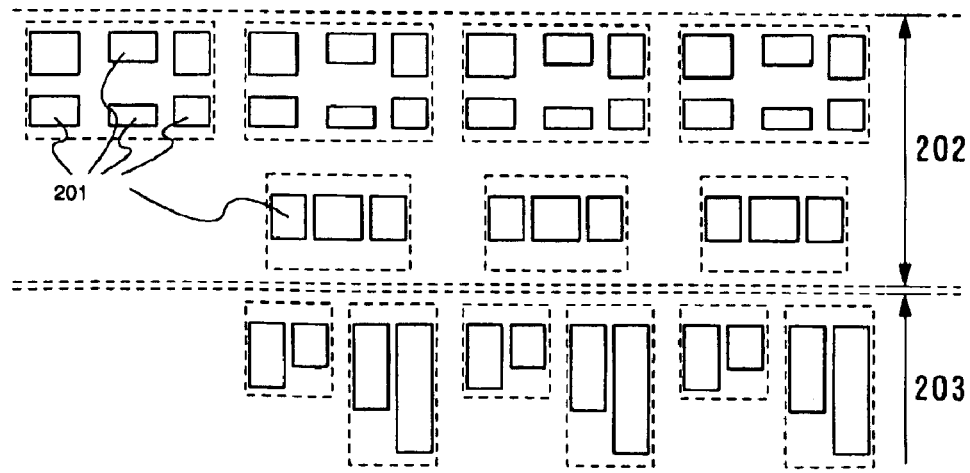

Of the regions constituting the circuit and shown in FIG. 2B, only regions that semiconductor layers actually occupy are shown in FIG. 2C. If the CW laser irradiation width is set to a laser irradiation range 1, a range indicated by 202 is scanned and then a range indicated by 203 is scanned. When island-like semiconductor layers 201 are arranged as shown in FIG. 2C, there are no island-like semiconductor layers in regions irradiated with the edges of CW laser light. The regions irradiated with the edges of CW laser light are where wires are led out later.

In other words, TFTs constituting the circuit are placed within the width of the effective CW laser irradiation region since the effective CW laser irradiation region is set to a fixed width.

Figure 9A:
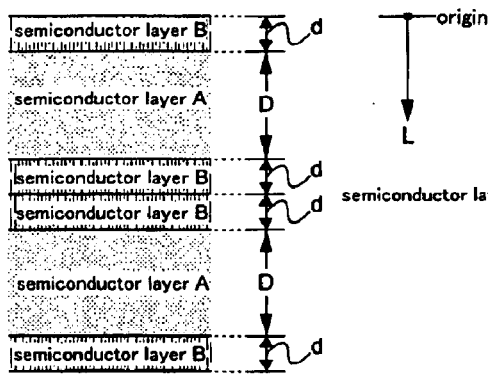
FIGS. 9A to 9D are diagrams for defining the overlap width and offset of CW laser irradiation regions.
Figure 9B:
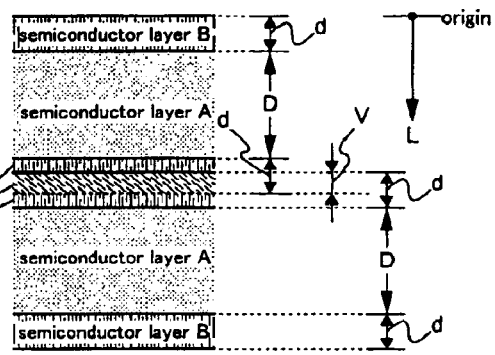
Figure 9C:
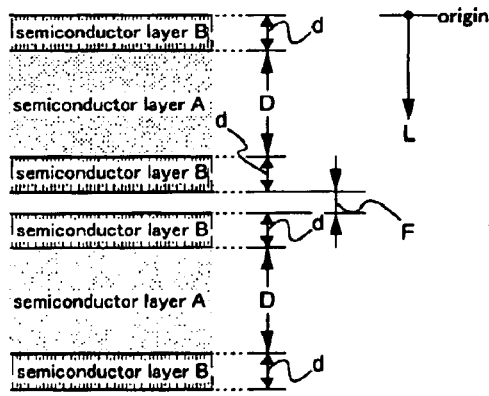

The width of the effective CW laser irradiation region (region crystallized as a semiconductor layer A) is given as D (D>0) and the left and right edges of the effective irradiation region (regions crystallized as semiconductor layers B) each have a width d (d≧0). Then, the width of the entire CW laser irradiation region is expressed as D+2d (FIG. 9A). The width of overlapped portions of CW laser irradiation regions (the width of overlap of adjacent laser beams) is given as V (FIG. 9B). When the overlap width V is smaller than 0 (V<0), namely, when CW laser irradiation regions do not overlap one another and there is a gap between a region irradiated in one scan and a region irradiated with the next scan, the width of this gap is called offset and given as F (F=|−V|) (FIG. 9C). The overlap width V is therefore V≧0. On a substrate where an amorphous semiconductor layer is formed and crystallized, an arbitrary point in an upper end of a CW laser irradiation region is set as the origin and a distance from the origin in the direction perpendicular to the CW laser scanning direction on the substrate is given as L. The distance L can be rephrased as a distance perpendicular to the laser light scanning direction on an irradiated area of an irradiation object.

(1) When the overlap width V is 0, no active layer is formed in a region that is an aggregation of points within a distance expressed by n(D+2d)−d≦L≦n(D+2d)+d and 0≦L (n is an integer, 0≦n).

(2) When the overlap width V is expressed as 0<V≦d, no active layer is formed in a region that is an aggregation of points within a distance expressed by n(D+2d)−d−(n−1)V≦L≦n(D+2d)+d−nV and 0≦L (n is an integer, 0≦n).

(3) When the overlap width V is expressed as d<V, no active layer is formed in a region that is an aggregation of points within a distance expressed by n(D+V)−V+d≦L≦n(D+V)+d and 0≦L (n is an integer, 0≦n).

(4) When the overlap width V is expressed as V<0, in other words, when the offset F is 0<F, no active layer is formed in a region that is an aggregation of points within a distance expressed by n(D+2d)−d+(n−1)F≦L≦n(D+2d)+d+nF and 0≦L (n is an integer, 0≦n).

Figure 9D:
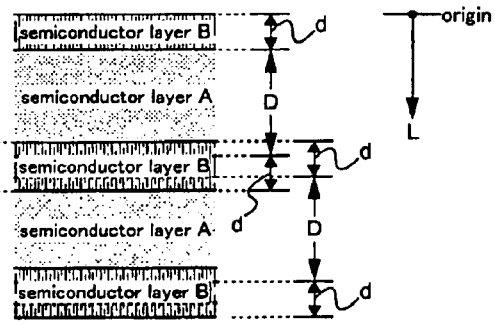

Now, overlap of CW laser beams and a crystallization state will be described. When the CW laser irradiation width overlaps, some regions receive CW laser irradiation more than once. In these regions, semiconductor layers are melted by the first laser irradiation and are crystallized when they return to a solid state. Receiving the next irradiation, the semiconductor layers in the regions repeat melting and crystallization. This means that the energy intensity of the CW laser in the last irradiation is dominant in the regions that have received CW laser irradiation several times. This means that, under the above Conditions 1 through 4, especially 3, a region that is crystallized as a semiconductor layer A by the first CW laser irradiation is again melted and then crystallized as a semiconductor layer B by the second CW laser irradiation as shown in FIG. 9D. This reduces the width of the semiconductor layer A that has excellent field effect mobility. Accordingly, the ratio of the semiconductor layer A on the substrate can be increased (the ratio reaches maximum when V=d) by setting the CW laser overlap width V to 0<V≦d as in the above Condition 2.

If semiconductor devices such as liquid crystal display devices and EL display devices are taken as an example, the screen size and the number of pixels are among specifications that are decided first in designing. Therefore, the pixel pitch is the first to be used as the reference. Assume here that the pixel pitch is 150 μm. Then, the CW laser feeding pitch (the feeding pitch means here how far the irradiation surface is moved perpendicular to the scanning direction from one scan over the substrate to the next scan and, in the case of FIG. 9A, namely, when the overlap width V is 0, the feeding pitch is D+2d, and the feeding pitch is D+d when the overlap width V is d) is set to an integral multiple of 150 μm, for example, 300 μm or 450 μm. The power supply lines or signal lines on the driving circuit side are arranged with the interval between the power supply lines or signal lines set in accordance with the feeding pitch. For instance, in FIG. 2C, the laser irradiation range is set to 300 μm or 450 μm.

Figure 24A:
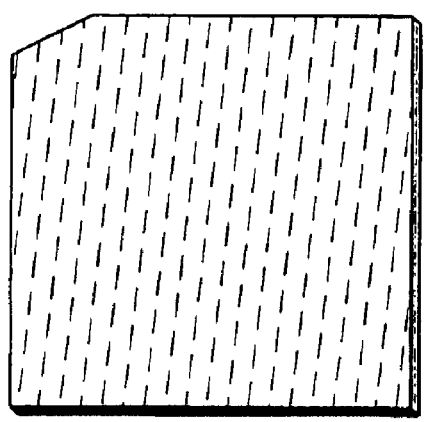
FIGS. 24A to 24D are diagrams illustrating alignment of a CW laser irradiation region and the active layer patterning position.
Figure 24B:
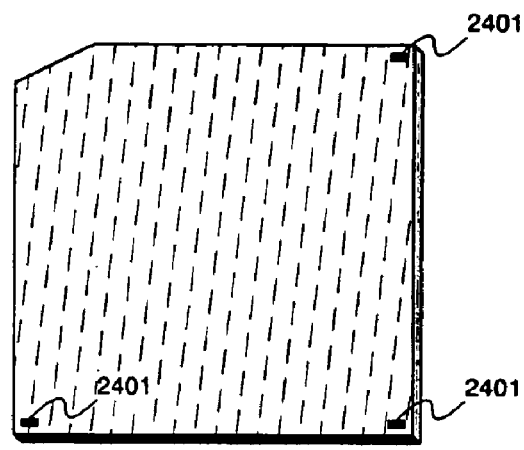
Figure 24C:
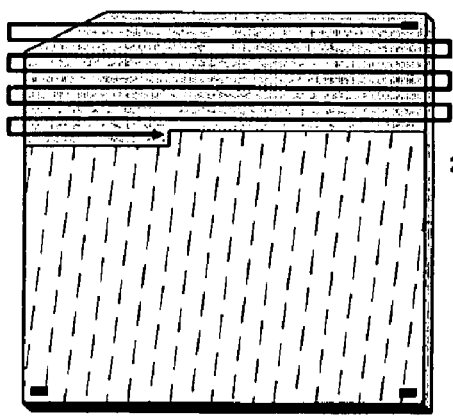
Figure 24D:
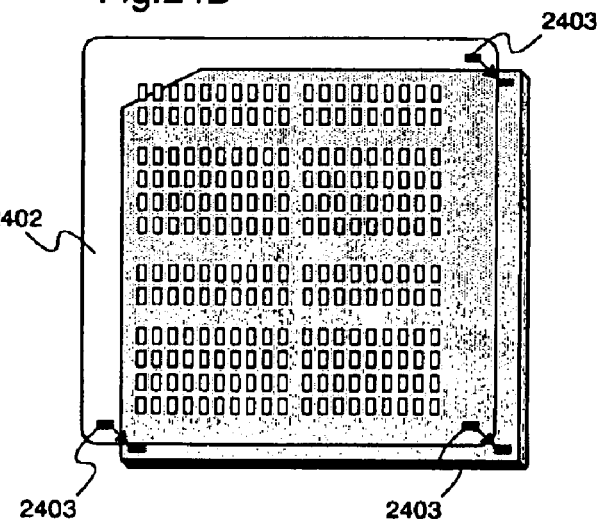

The manufacture process in practice needs to position an active layer patterning mask in accordance with the CW laser irradiation pitch. Therefore, after formation of an amorphous semiconductor layer on a substrate (FIG. 24A) and prior to CW laser irradiation, alignment markers 2401 are formed (FIG. 24B). Then, CW laser irradiation is conducted with the alignment markers 2401 as the origin (FIG. 24C). Thereafter, an active layer patterning mask 2402 is positioned using the alignment markers 2401 and alignment markers 2403 on the mask 2402 as the reference to pattern the active layer (FIG. 24D). This method makes it possible to accurately set positions for forming active layers in accordance with the CW laser irradiation pitch.

If the circuit layout is determined based on the above terms, TFTs having excellent electric characteristics can be obtained to build a semiconductor device.

Embodiments of the present invention will be described below.

Embodiment 1

This embodiment gives several examples on circuit arrangement on a substrate, the CW laser irradiation direction, and the like in a display device.

Figure 4A:
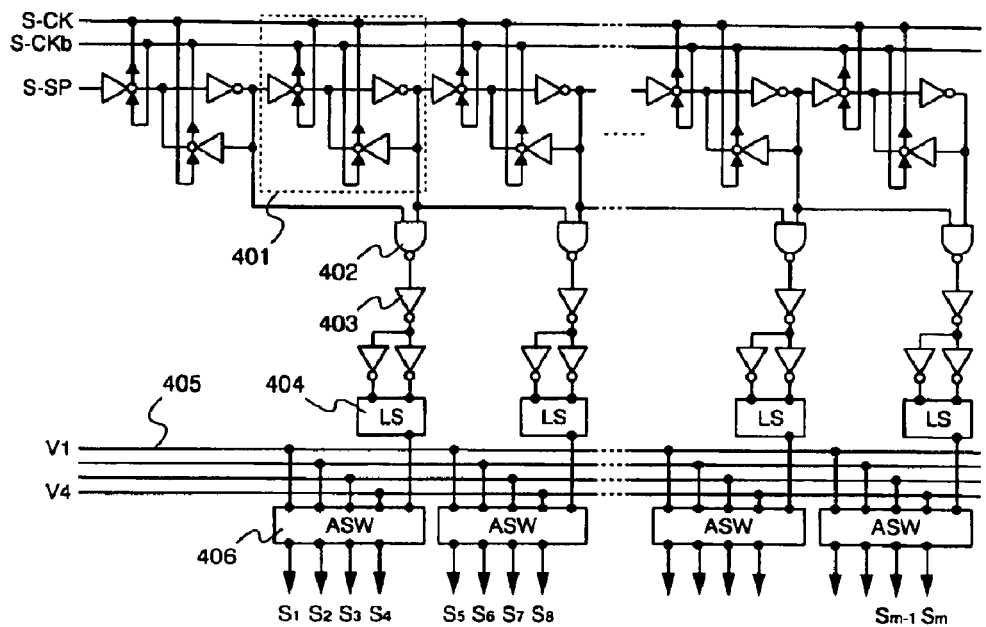
FIGS. 4A and 4B are a diagram showing an example of a source signal line driving circuit in a display device and a diagram showing an example of a gate signal line driving circuit in the display device, respectively.
Figure 4B:
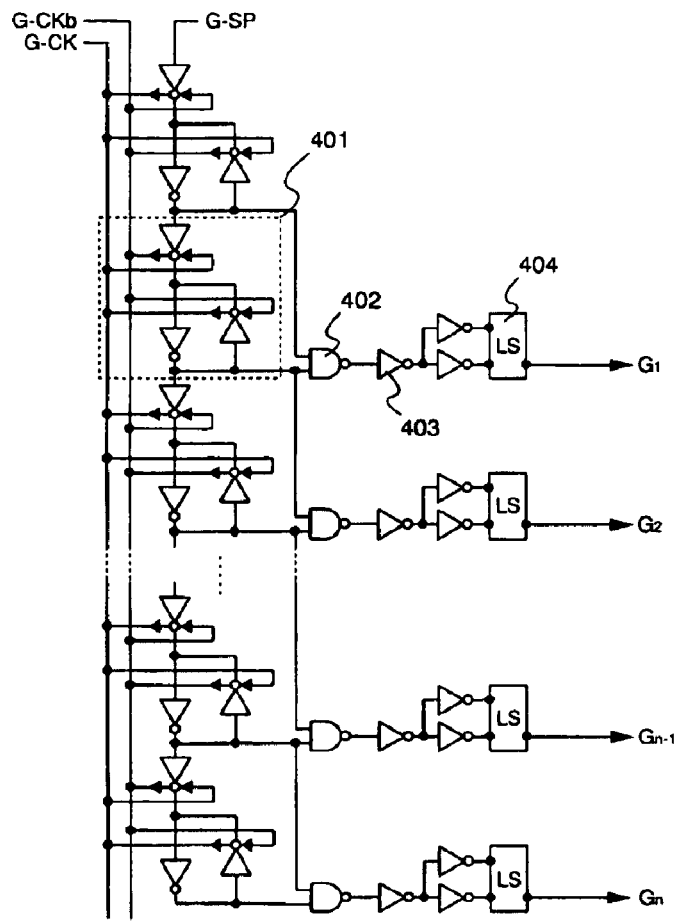

FIGS. 4A and 4B are driving circuit diagrams given as an example for a display device that displays an image by inputting analog video signals. FIG. 4A shows a source signal line driving circuit, which is composed of a shift register, NANDs 402, inverters 403, level shifters 404, sampling switches 406, video signal lines 405, etc. The shift register is composed of plural stages of D-flip-flops 401. The video signal lines 405 receive video signals. The shift register sequentially outputs sampling pulses in response to clock signals (S-CK and S-CKb) and start pulses (S-SP). After amplitude conversion and other processing, the sampling switches 406 separately sample video signals upon input of the sampling pulses and output the signals to source signal lines ($S_l$ to $S_m$).

FIG. 4B shows a gate signal line driving circuit, the structure of which is generally similar to the source signal line driving circuit. The gate signal line driving circuit has a shift register, NANDs 402, inverters 403, level shifters 404, etc. The shift register is composed of plural stages of D-flip-flops 401. The shift register sequentially outputs sampling pulses in response to clock signals (G-CK and G-CKb) and start pulses (G-SP). After amplitude conversion and other processing, each of the gate signal lines ($G_l$ to $G_n$) is selected one by one.

Figure 3A:
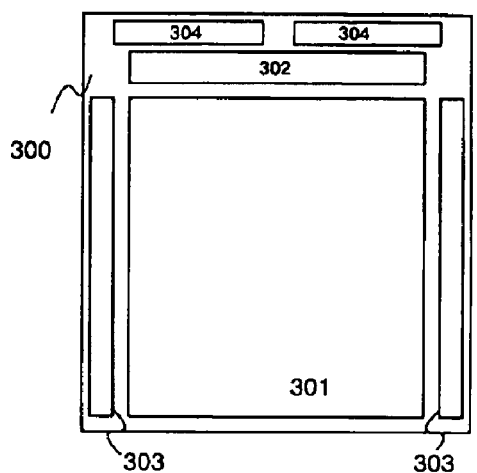
FIGS. 3A to 3E are diagrams showing examples of the direction and order of a CW laser scanning over a substrate.

The display device is structured as shown in FIG. 3A. A pixel portion 301 is positioned in the center of a substrate 300. A source signal line driving circuit 302 is above or below the pixel portion 301. A gate signal line driving circuit 303 is to the left or right of the pixel portion 301, or on each side of the pixel portion 301. Signals and power for operating each of the driving circuits are inputted through a flexible printed circuit (FPC) 304 from the outside of the substrate.

Figure 3B:
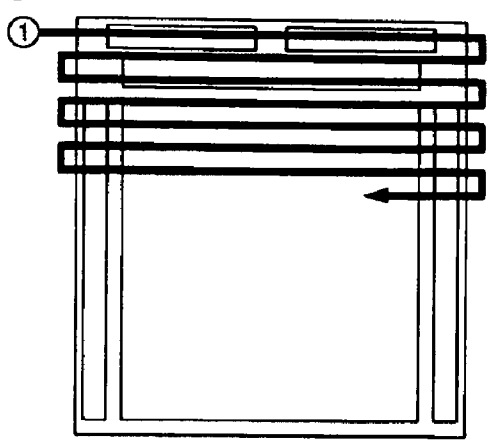

As shown in FIG. 3A, the source signal line driving circuit 302 is extended in the column direction of pixels whereas the gate signal line driving circuit 303 is extended in the row direction of the pixels. Therefore, if the device is subjected to the CW laser irradiation of Embodiment Mode, the CW laser irradiation direction directed to the direction in which the source signal line driving circuit is arranged does not match the direction in which the gate signal line driving circuit is arranged as shown in FIG. 3B. However, in contrast to source signal line driving circuits that are in general required to drive at high speed, gate signal line driving circuits only have to have a drive frequency several hundreds times smaller than the drive frequency of source signal line driving circuits. Therefore, the gate signal line driving circuit can operate with no trouble when a semiconductor layer B is included in active layers of TFTs that constitute the gate signal line driving circuit.

Figure 3C:
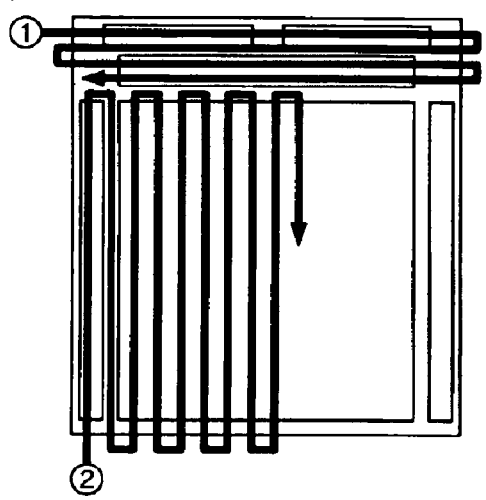

If all TFTs that constitute the display device are to be formed on semiconductor layers A, the scanning direction may be switched during CW laser irradiation as shown in FIG. 3C. To elaborate, first CW laser scanning is conducted with the feeding pitch set for the source signal line driving circuit and then a stage to which the substrate is fixed is rotated by 90° to change the laser scanning direction for second CW laser irradiation in which the feeding pitch is set for the gate signal line driving circuit and the pixel portion.

Figure 3D:
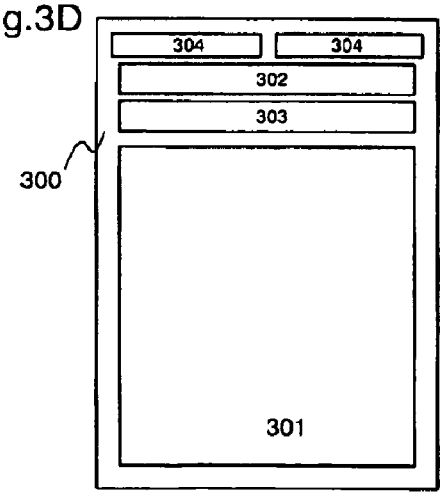
Figure 3E:
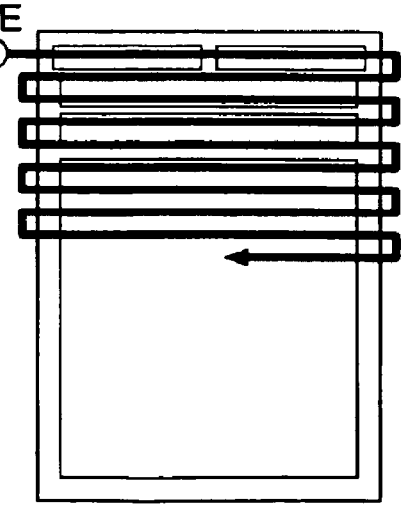

Using the technique disclosed in Japanese Patent Application No. 2001-241463, the source signal line driving circuit 302 and the gate signal line driving circuit 303 may be placed in parallel on one side of the pixel portion as shown in FIG. 3D or on opposing two sides of the pixel portion. This makes it possible to crystallize the entire surface of the substrate in one CW laser irradiation and to use TFTs having semiconductor layers A as their active layers for the pixel portion and the driving circuits both.

The methods shown in this embodiment are merely examples and there are other choices. For instance, only a driving circuit portion where high speed driving is required may be crystallized by a CW laser while a common crystallization method is used to form a pixel portion and other portions where the drive speed required is not so high. This embodiment may be combined with other embodiments.

Embodiment 2

Figure 5A:
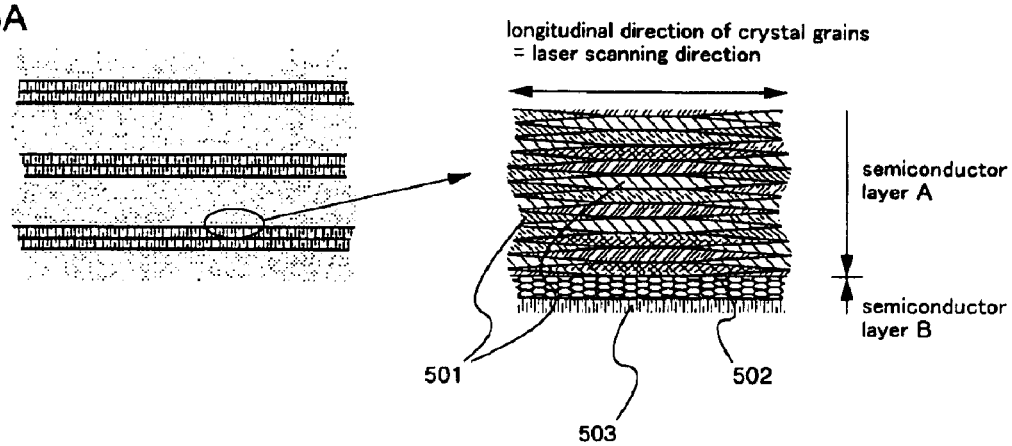
Figure 5A:
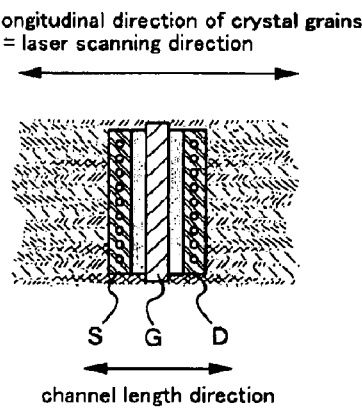
Figure 5A:
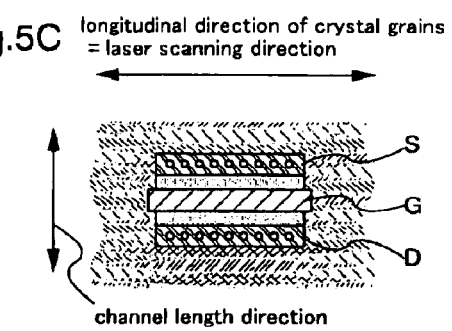

A state of semiconductor layers on a substrate after crystallization by a CW laser is schematically shown in FIG. 5A. As has been described, regions irradiated with the edges of laser light where the energy density is not enough become crystallized semiconductor layer that are semiconductor layers B having crystals of small grain sizes, or microcrystals, whereas region melted and crystallized with enough energy density become crystallized semiconductor layers that are semiconductor layers A, namely, an aggregation of large crystal grains stretching long in parallel to the CW laser irradiation direction.

In the CW laser irradiation direction, namely, the longitudinal direction of crystal grains in the semiconductor layers A, the crystals are in a good state. On the other hand, there are many grain boundaries in the direction perpendicular to the CW laser irradiation direction, namely, the lateral direction of the crystal grains in the semiconductor layers A. The orientation is uniform within one crystal whereas separate crystal grains have different orientations and the orientation changes at the grain boundary. This results in anisotropic electric characteristics.

In short, there are only a few grain boundaries in the direction parallel to the longitudinal direction of crystal grains, or neighboring direction and there is little hindrance to movement of electric charges. Accordingly, it exhibits excellent field effect mobility. In contrast to this, the direction perpendicular to the longitudinal direction of crystal grains or neighboring direction has many grain boundaries and the orientation varies among them. Therefore, movement of electric charges in this direction are hindered more compared to the former.

In conclusion, it is easier to obtain more excellent electric characteristics when TFTs are arranged such that the channel length direction is parallel to the longitudinal direction of crystal grains or in neighboring direction as shown in FIG. 5B than when TFTs are arranged such that the channel length direction is perpendicular to the longitudinal direction of crystal grains or in neighboring direction as shown in FIG. 5C. This embodiment may be combined with other embodiments and, in the layout example shown in FIG. 2B, TFTs are arranged taking this point into consideration.

Embodiment 3

This embodiment describes an example of a laser crystallization process using a CW laser.

A CW laser suitable for the process is one having a wavelength of 550 nm or less and having highly stable power. For example, the second harmonic of a $YVO_4$ laser, the second harmonic of a YAG laser, the second harmonic of a YLF laser the second harmonic of a $YAlO_3$ laser, and an Ar laser meet the requirement. The third or higher harmonic of these lasers may also be used. Alternatively, an alexandrite laser, a Ti:sapphire laser, a continuous wave excimer laser, Kr laser, or $CO_2$ laser, or a continuous wave helium cadmium laser, copper steam laser, or gold steam laser may be employed. It is also possible to employ plural lasers of one type or different types chosen from those lasers.

Figure 7:
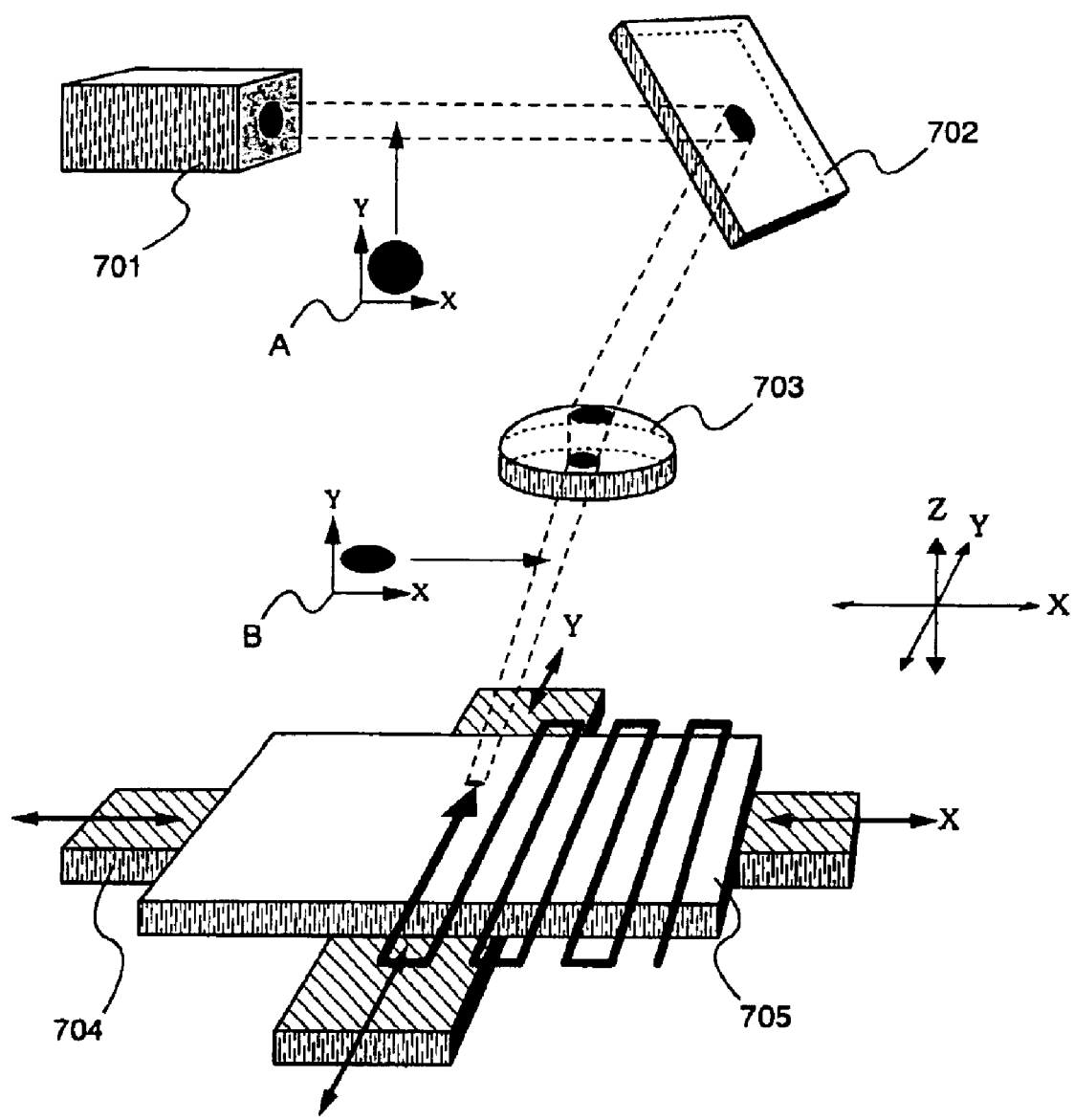
FIG. 7 is a schematic diagram of the CW laser irradiation apparatus.
Figure 8A:
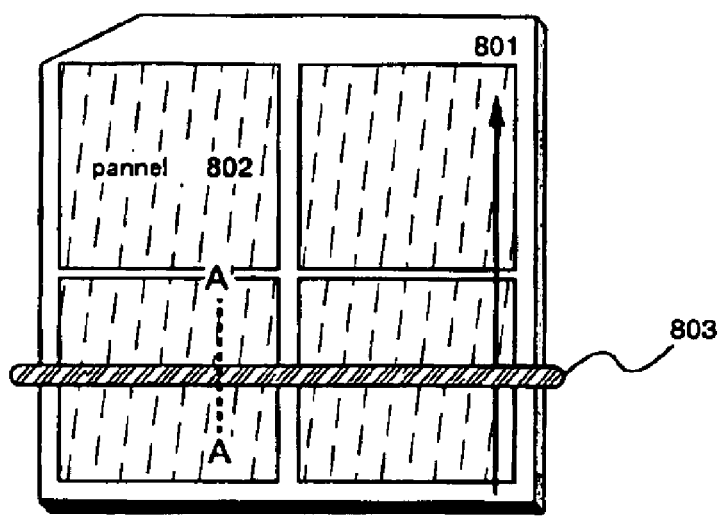
FIGS. 8A and 8B are diagrams showing a linear pulse laser scanning the top face of a substrate and crystallizing a semiconductor film.
Figure 8B:
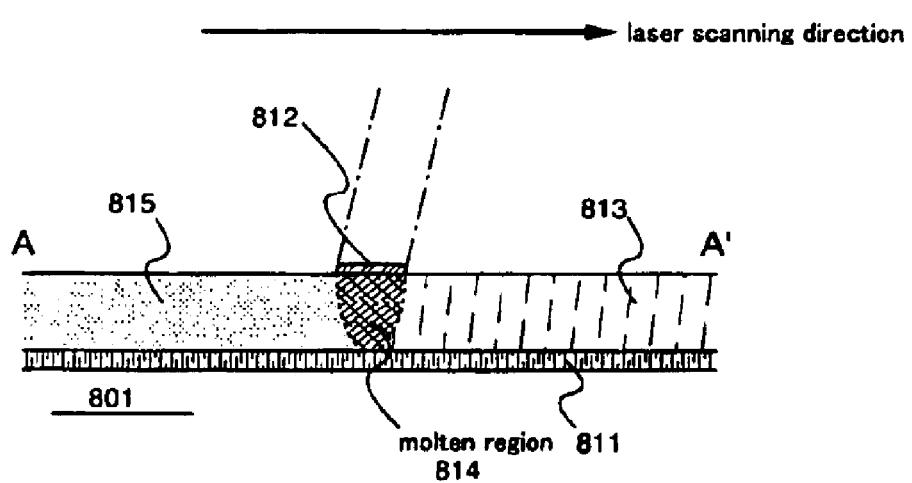

FIG. 7 is a schematic representation of an apparatus for CW laser crystallization. The apparatus is composed of a laser oscillator 701, a mirror 702, a convex lens 703, an X-Y stage 704, etc. The laser used here is a 10 W power continuous wave $YVO_4$ laser. The laser oscillator 701 is provided with a non-linear optical element and emits the second harmonic from its exit.

A laser beam emitted from the laser oscillator 701 has a circular shape as indicated by A in FIG. 7. The laser beam is emitted in the horizontal direction and is deflected by the mirror 702 toward the direction about 20° from the vertical direction. Thereafter, the beam is collected by the convex lens 703 positioned in the horizontal direction. A substrate 705 is fixed to the X-Y stage 704 and an irradiation surface on a semiconductor layer that is formed on the substrate is brought to the focus of the convex lens 703. At this point, the irradiation surface is arranged such that it is in parallel with the convex lens 703. In other words, the substrate 705 is arranged horizontally. The laser beam enters the convex lens 703 at about 20° and therefore the laser beam obtains an elliptical shape on the irradiation surface due to astigmatism of the convex lens. The laser beam shape on the irradiation surface is determined by the incident angle at which the laser beam enters the convex lens 703. Accordingly, the laser beam can have an elliptical shape of larger aspect ratio by making it enter the convex lens at a larger angle to the vertical direction. On the other hand, this makes the penetration shallow and uniform irradiation difficult. The suitable deflection angle is therefore about 20°.

In order to crystallize semiconductor layers on the entire surface of the substrate, it is necessary to repeatedly run an elliptical beam over the substrate at a suitable irradiation pitch while shifting the beam in its longer diameter direction. This operation is achieved by fixing a laser output unit that is composed of the laser oscillator 701, the mirror 702, and the convex lens 703 while moving the X-Y stage 704 to move the substrate in a manner that makes the elliptical beam run over the substrate. When the substrate, i.e., the irradiation object, measures 600 mm in the X direction and 720 mm in the Y direction and the elliptical beam measures 200 µm in the longer diameter direction, it requires 3000 times of laser scanning (1500 times of reciprocation) in the direction shown in FIG. 7 to irradiate the entire surface of the substrate.

Figure 23:
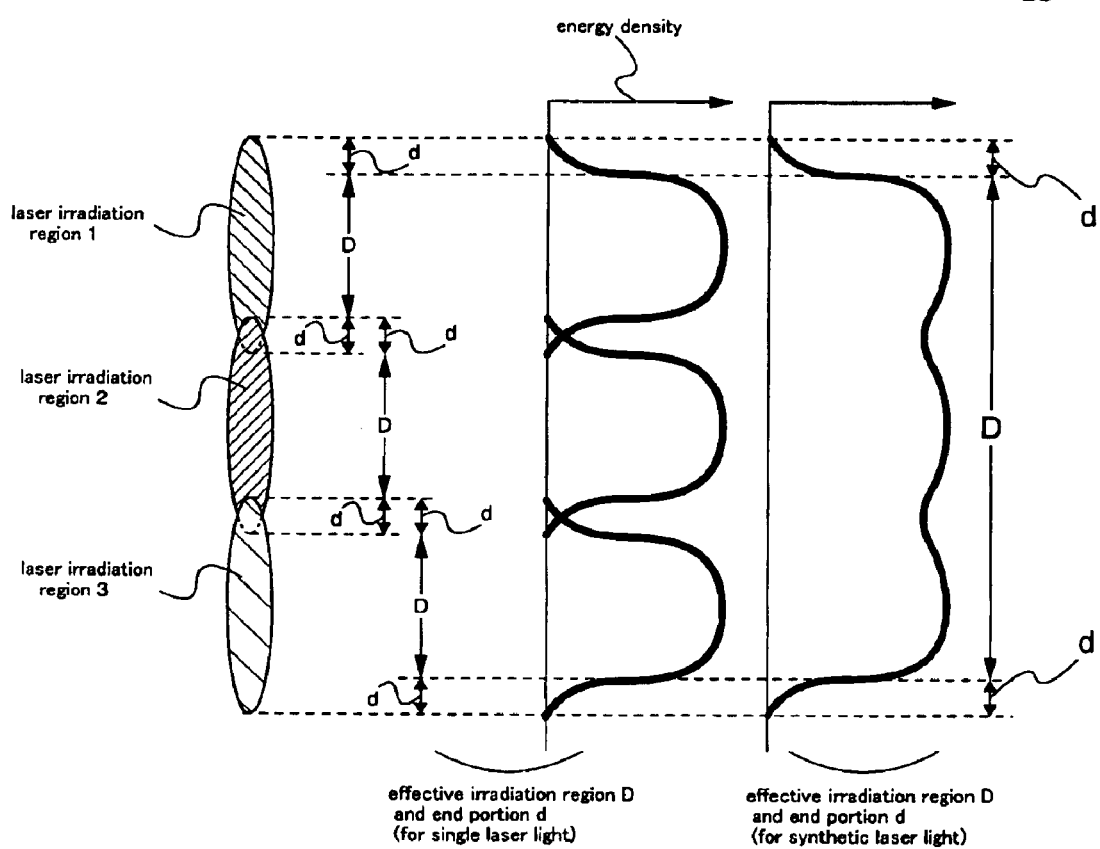
FIG. 23 is a diagram showing an example of arranging a plurality of elliptical lasers to use as a synthetic laser.

The number of scanning can be reduced and the processing time can be shortened by using plural laser oscillators and scanning the substrate with plural elliptical beams arranged side by side in the longer diameter direction of the ellipse as shown in FIG. 23. This way low energy density portions at the edges of a single laser beam overlap with low energy density portions at the edges of adjacent laser beams, thereby raising the energy density. As a result, the effective irradiation region is widened and the ratio of the effective irradiation region to the whole irradiation region in one irradiation is increased to further reduce limitations in circuit layout.

This embodiment may be combined with other embodiments.

Embodiment 4

Figure 6:
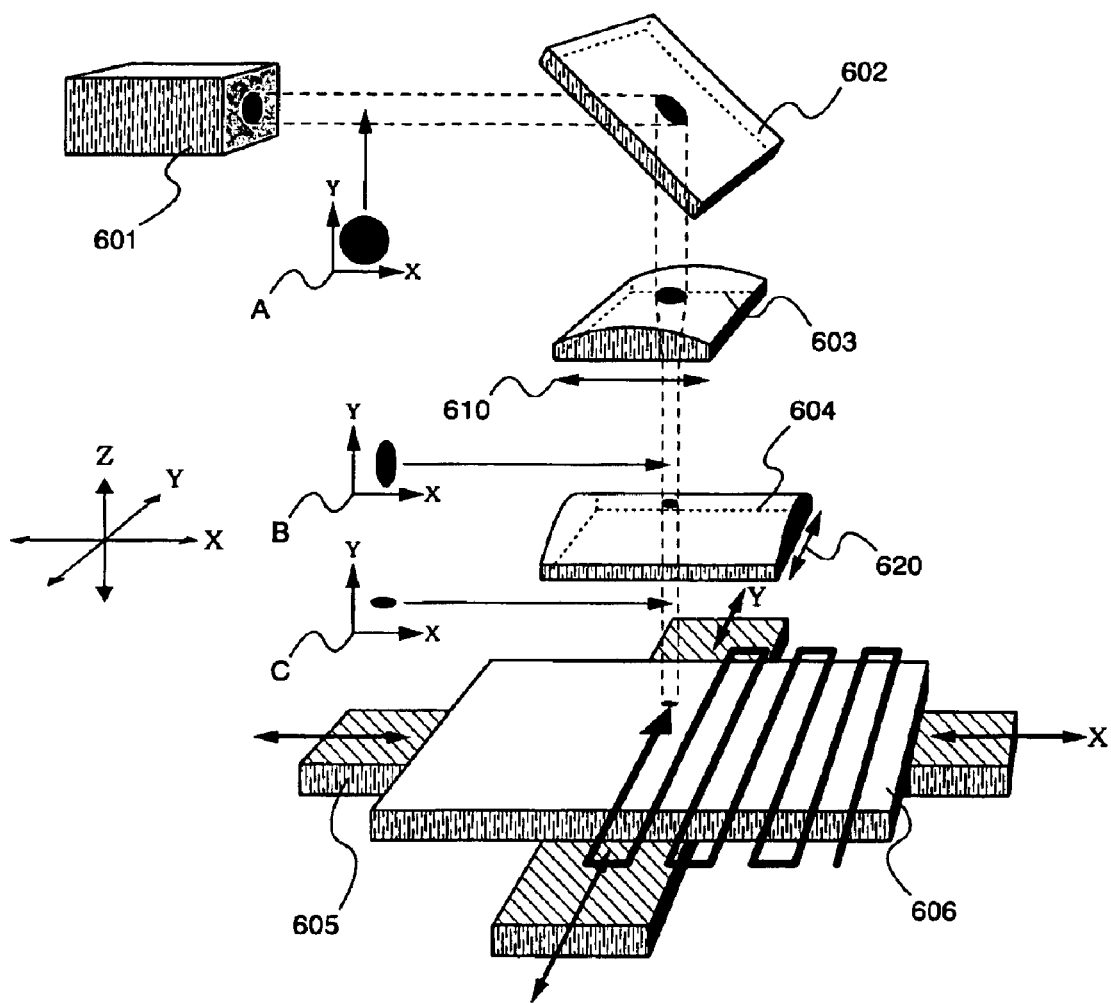
FIG. 6 is a schematic diagram of a CW laser irradiation apparatus.

This embodiment gives a description with reference to FIG. 6 on an example of using an optical system different from the one in Embodiment 3 to polarize a laser beam.

A laser beam emitted from a laser oscillator 601 has a circular shape as indicated by A in FIG. 6. The laser beam is emitted in the horizontal direction and is deflected by a mirror 602 toward the vertical direction. Thereafter, the beam is collected by a first cylindrical lens 603 in the X direction. At this point, the circular shape of the laser beam is collected in the X direction and an elliptical shape with the longer diameter set in the Y direction is obtained as indicated by B in FIG. 6. The laser beam is then collected by a second cylindrical lens 604 in the Y direction. At this point, the laser beam is further collected in the Y direction and an elliptical shape with the longer diameter set in the X direction is obtained as indicated by C in FIG. 6. This optical system can provide an elliptical beam having an aspect ratio even larger than that of the laser beam shown in Embodiment 3. A substrate 606 fixed to an X-Y stage 605 is irradiated with this elliptical laser beam. For laser beam scanning over the substrate, see Embodiment 3.

The number of scanning can be reduced and the processing time can be shortened by using plural laser oscillators and scanning the substrate with plural elliptical beams arranged side by side in the longer diameter direction of the ellipse as shown in FIG. 23. This way low energy density portions at the edges of a single laser beam overlap with low energy density portions at the edges of adjacent laser beams, thereby raising the energy density. As a result, the effective irradiation region is widened and the ratio of the effective irradiation region to the whole irradiation region in one irradiation is increased to further reduce limitations in circuit layout.

This embodiment may be combined with other embodiments.

Embodiment 5

This embodiment describes an example of a process from formation to crystallization of a semiconductor layer.

A silicon oxynitride film (composition ratio: Si=32%, O=59%, N=7%, H=2%) is formed as a base film by plasma CVD to have a thickness of 400 nm on a glass substrate. On the base film, an amorphous silicon film with a thickness of 150 nm is formed as a semiconductor layer by plasma CVD. The semiconductor layer is then subjected to heat treatment at 500° C. for 3 hours to release hydrogen contained in the semiconductor layer and crystallized by laser annealing.

The laser used in the laser annealing is the second harmonic of a continuous wave $YVO_4$ laser (wavelength: 532 nm). Here, the semiconductor layer is irradiated with a laser beam following Embodiment 3 or 4.

Figure 10:
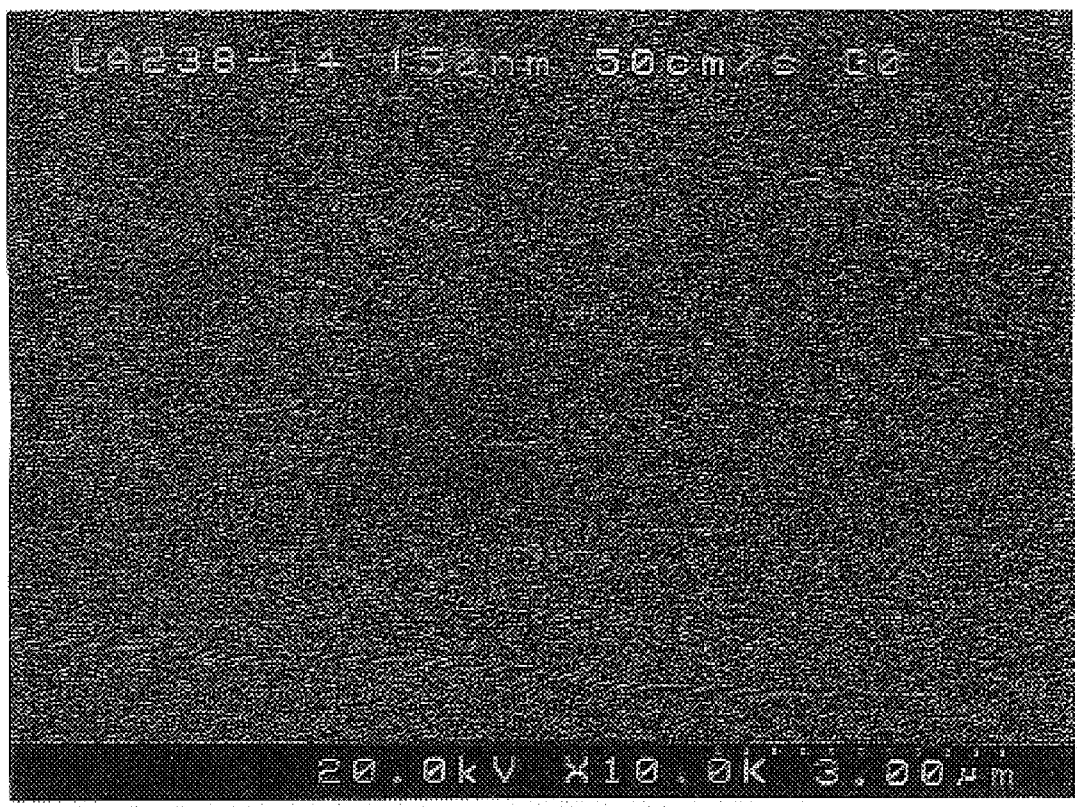
FIG. 10 is a view observing the surface of a semiconductor layer after CW laser crystallization.
Figure 10:
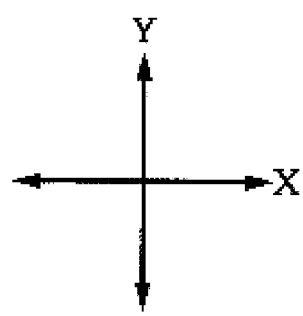

The thus obtained crystalline semiconductor layer is subjected to secco etching and its surface is observed by a scanning electron microscope (SEM) at 10000 power. The result is shown in FIG. 10. The secco solution in secco etching is obtained from HF and $H_2O$ at a ratio of 2:1 using $K_2Cr_2O_7$ as an additive. It is confirmed from FIG. 10 that the laser beam scanning direction on the substrate is in the X direction and that the longitudinal direction of crystal grains run in parallel to the scanning direction or in neighboring direction. In short, crystals grow extending in the laser beam scanning direction.

Crystal grains of large grain sizes are formed in the semiconductor layer crystallized by the process shown in this embodiment. Therefore, a TFT using this semiconductor layer as an active layer has less grain boundaries in its channel formation region. Each crystal grain has such an excellent crystallinity that the grain substantially equals a single crystal, and accordingly the semiconductor layer of this embodiment can provide the same level, or nearly the same level of field effect mobility as a transistor formed from a single crystal semiconductor.

If the direction in which crystal grains extend is set parallel to the moving direction of electric charges, namely, the drain current flow direction, or in neighboring direction, movement of electric charges is hindered very infrequently by crystal grain boundaries as described in Embodiment 2. This also makes it possible to reduce fluctuation in ON current, OFF leak current, threshold, S value, field effect mobility, and the like among transistors and these electric characteristics are greatly improved.

This embodiment may be combined with other embodiments.

Embodiment 6

Embodiment 5 has described an example of a process from formation to crystallization of a semiconductor layer. This embodiment gives another example thereof.

First, a semiconductor layer is formed from an amorphous silicon film following Embodiment 5. Then, using a method disclosed in JP 07-183540 A, a nickel acetate solution (concentration by weight: 5 ppm, 10 ml) is applied onto the semiconductor layer by spin coating. The semiconductor layer is subjected to heat treatment at 500° C. for an hour in a nitrogen atmosphere and at 550° C. for 12 hours in a nitrogen atmosphere. As a result, crystals grow in the semiconductor layer using nickel as a catalyst and a first crystalline semiconductor layer is obtained. Thereafter, the crystallinity of the first crystalline semiconductor layer is improved by laser annealing to obtain a second crystalline semiconductor layer.

The laser used in the laser annealing is the second harmonic of a continuous wave $YVO_4$ laser (wavelength: 532 nm). Here, the semiconductor layer is irradiated with a laser beam following Embodiment 3 or 4.

Figure 11:
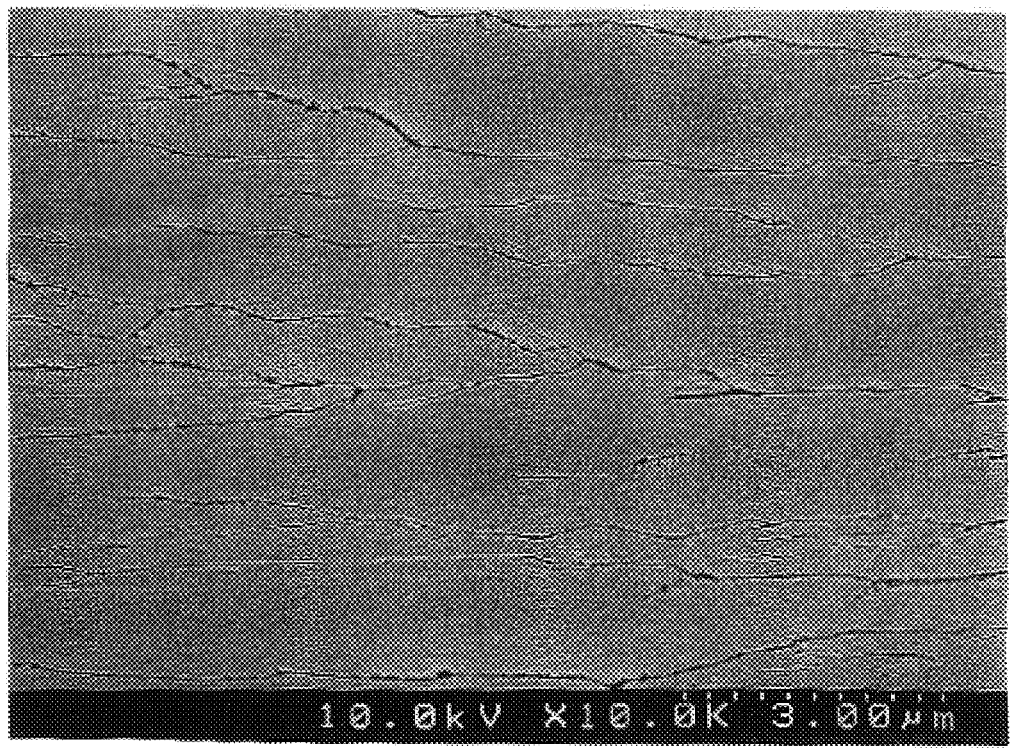
FIG. 11 is a view observing the surface of a semiconductor layer after CW laser crystallization.
Figure 11:
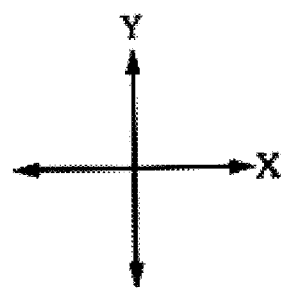

The thus obtained second crystalline semiconductor layer is subjected to secco etching and its surface is observed by SEM at 10000 power The result is shown in FIG. 11. The semiconductor layer shown in FIG. 11 is obtained through crystallization by running the laser beam over the substrate in the X direction in the drawing, and it is confirmed from FIG. 11 that crystals grow extending in the laser beam scanning direction.

Figure 12:
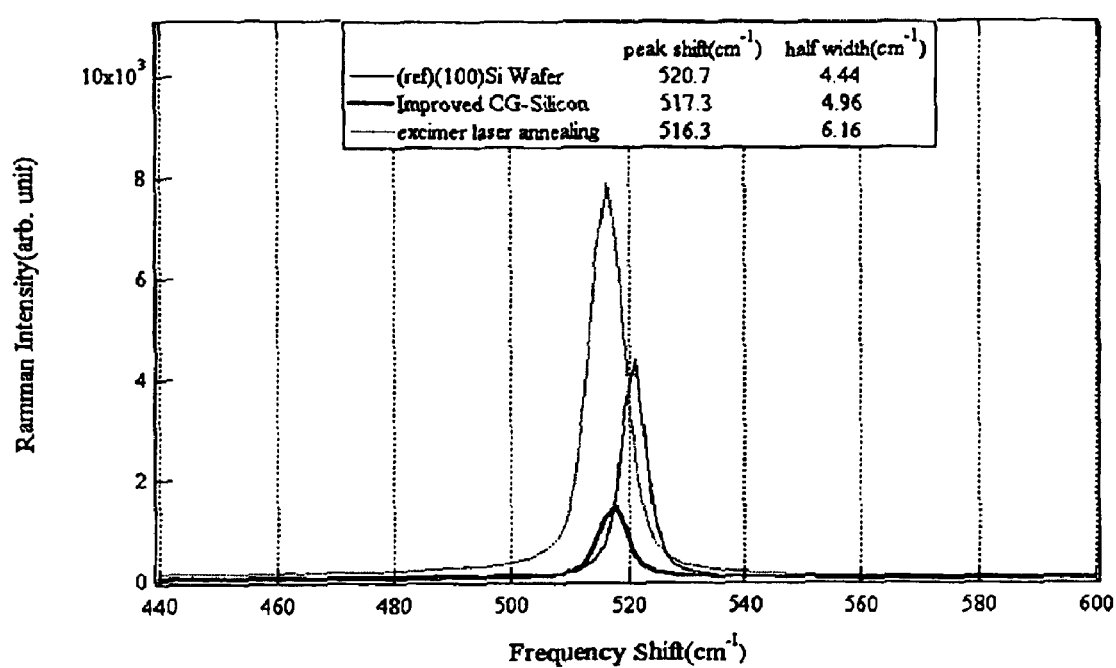
FIG. 12 is a diagram for comparing results of Raman scattering spectroscopy among a semiconductor layer obtained by CW laser crystallization, a semiconductor layer obtained by excimer laser crystallization, and a single crystal silicon wafer.

Raman scattering spectroscopy is performed on the semiconductor layer obtained by the process shown in this embodiment and the result is shown as a bold line in FIG. 12 (the semiconductor layer obtained in this embodiment is referred to as Improved CG silicon in FIG. 12). For comparison, the result of Raman scattering spectroscopy performed on single crystal silicon (referred to as Ref. (100) Si Wafer) is shown as a thin line in FIG. 12.

The Raman shift of the semiconductor layer obtained by the process shown in this embodiment has a peak at 517.3 $cm^{-1}$ and its half width is 4.96 $cm^{-1}$. On the other hand, the Raman shift of single crystal silicon has a peak at 520.7 $cm^{-1}$ and its half width is 4.44 $cm^{-1}$. The Raman shift of a semiconductor layer crystallized by a pulse oscillation excimer laser has a peak at 516.3 cm$^{-1}$ and its half width is 6.16 cm$^{-1}$.

It is understood from the results shown in FIG. 12 that the crystallinity of the semiconductor layer obtained by the process shown in this embodiment is closer to the crystallinity of single crystal silicon than that of the semiconductor layer crystallized by the pulse oscillation excimer laser.

This embodiment may be combined with other embodiments.

Embodiment 7

This embodiment describes an example of manufacturing TFTs using as active layers a semiconductor layer that is crystallized by the process shown in Embodiment 5. The description is given with reference to FIGS. 15A to 15H.

A substrate 1501 is a quartz substrate, silicon substrate, metal substrate, or stainless steel substrate with an insulating film formed over its surface. A plastic substrate may be employed if it has a heat resistance that can withstand treatment temperature in this manufacture process. In this embodiment, a substrate made of glass such as barium borosilicate glass or alumino borosilicate glass is used.

Figure 15A:
FIGS. 15A to 15H are diagrams illustrating a process of manufacturing TFTs.

First, a silicon oxynitride film (composition ratio: Si=32%, O=27%, N=24%, H=17%) with a thickness of 50 nm and a silicon oxynitride film (composition ratio: Si=32%, O=59%, N=7%, H=2%) with a thickness of 100 nm are formed and layered as a base film 1502 by plasma CVD on the substrate 1501. On the base film 1502, an amorphous semiconductor layer 1503 with a thickness of 150 nm is formed by plasma CVD and then subjected to heat treatment at 500° C. for 3 hours to release hydrogen contained in the semiconductor layer (FIG. 15A).

Figure 15B:
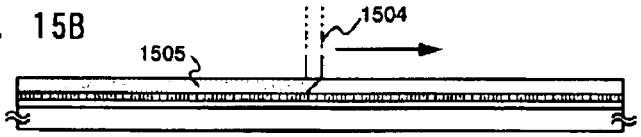

Thereafter, the second harmonic of a continuous wave YVO$_4$ laser (wavelength: 532 nm, 5.5 W) is used to scan and irradiate the entire surface of the amorphous semiconductor layer 1503 for crystallization by the method shown in Embodiment 3 or 4. Thus obtained is a crystalline semiconductor layer 1505 (FIG. 15B).

Figure 15C:
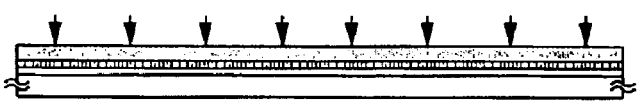

Then, first doping treatment is conducted in order to control the threshold voltage of TFTs. In the first doping treatment, diborane (B$_2$H$_6$) is used as the material gas, and the gas flow rate is set to 30 sccm, the current density to 0.05 μA, the acceleration voltage to 60 keV, and the dose to $1\times10^{14}$ atoms/cm$^2$ (FIG. 15C).

Figure 15D:
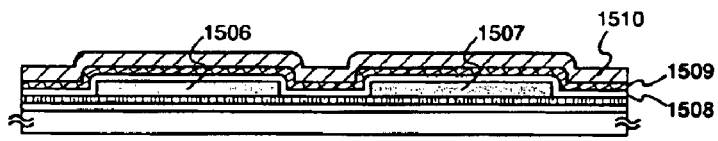

Subsequently, the crystalline semiconductor layer 1505 is patterned into a desired shape to obtain island-like semiconductor layers (hereinafter simply referred to as semiconductor layers) 1506 and 1507. After that, a silicon oxynitride film is formed as a gate insulating film 1508 by plasma CVD to have a thickness of 115 nm. On the gate insulating film 1508, a TaN film 1509 with a thickness of 30 nm and a W film 1510 with a thickness of 370 nm are layered as a conductive layer (FIG. 15D).

Next, a resist mask (not shown in the drawing) is formed using photolithography to etch the W film, the TaN film, and the gate insulating film. While the areas covered with the resist mask are not etched, gate electrodes formed of a TaN film 1512 and a W film 1513 are obtained as well as a gate insulating film 1511.

The conductive layer for forming the gate electrodes has a laminate structure consisting of a TaN film and a W film in this embodiment. However, the conductive layer may be a single layer or may be a laminate of three or more layers.

Figure 15E:
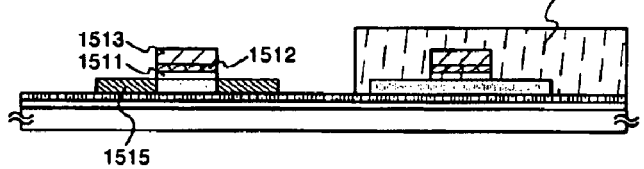

Thereafter, the resist mask is removed and a new resist mask 1514 is formed for second doping treatment to dope desired semiconductor layers with an impurity element that imparts the n type conductivity. In the second doping treatment, the gate electrodes formed of the conductive layers 1512 and 1513 serve as masks against the impurity element that imparts the n type conductivity and a first impurity region 1515 is formed in a self-aligning manner. In this embodiment, the treatment is carried out in two stages using two sets of conditions since the semiconductor layers are as thick as 150 nm. The material gas used is phosphine (PH3). The dose is set to $2\times10^{13}$ atoms/cm$^2$ and the acceleration voltage is set to 90 keV. Then, the dose is set to $5\times10^{14}$ atoms/cm$^2$ and the acceleration voltage is set to 10 keV (FIG. 15E).

Figure 15F:
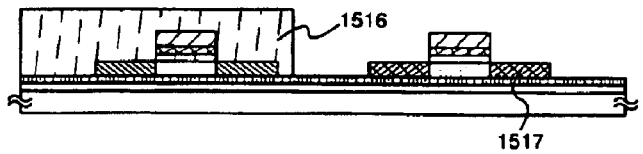

Thereafter, the resist mask 1514 is removed and a new resist mask 1516 is formed for third doping treatment to dope desired semiconductor layers with an impurity element that imparts the p type conductivity. Similar to the second doping treatment, the gate electrodes formed of the conductive layers 1512 and 1513 serve as masks against the impurity element that imparts the p type conductivity in the third doping treatment and a second impurity region 1517 is formed in a self-aligning manner. The third doping treatment is also carried out in two stages using two sets of conditions since the semiconductor layers are as thick as 150 nm. The material gas used is diborane (B$_2$H$_6$). The dose is set to $2\times10^{13}$ atoms/cm$^2$ and the acceleration voltage is set to 90 keV. Then, the dose is set to $1\times10^{15}$ atoms/cm$^2$ and the acceleration voltage is set to 10 keV (FIG. 15F).

Through the above steps, the first impurity region 1515 and the second impurity region 1517 are formed in the semiconductor layer 1506 and the semiconductor layer 1507, respectively.

Next, the resist mask 1516 is removed and a silicon oxide film (composition ratio: Si=32.8%, O=63.7%, H=3.5%) is formed as a first interlayer insulating film 1518 by plasma CVD to have a thickness of 50 nm.

Figure 15G:
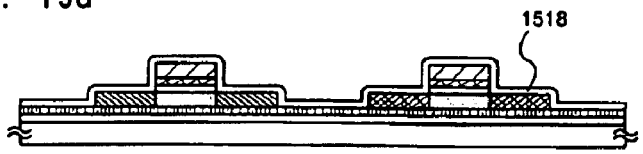

Then, heat treatment is conducted to restore the crystallinity of the semiconductor layers and activate the impurity elements used to dope the semiconductor layers. In this embodiment, thermal annealing is employed and heat treatment is conducted in an annealing furnace in a nitrogen atmosphere at 550° C. for four hours (FIG. 15G).

Next, a second interlayer insulating film 1519 is formed on the first interlayer insulating film 1518. In this embodiment, a silicon nitride film with a thickness of 50 nm is formed by CVD and then a silicon oxide film with a thickness of 400 nm is formed as the second interlayer insulating film. The second interlayer insulating film is mainly for planarization and therefore it is desirable to use a material that can level the surface well. An organic insulating material such as acrylic may also be employed to form the second interlayer insulating film.

Then, another heat treatment is conducted for hydrogenation where dangling bonds in the active layers are terminated. This embodiment employs thermal annealing and heat treatment is conducted in an annealing furnace in a nitrogen atmosphere at 410° C. for an hour.

Thereafter, contact holes reaching the impurity regions are opened to form wires 1520. The wires 1520 in this embodiment are obtained by patterning a laminate consisting of a 50 nm thick Ti film, a 500 nm thick Al—Si film, and another 50 nm thick Ti film. A single layer conductive film or a laminate of three or more layers may be used to form the wires. The wire materials are not limited to Al and Ti and materials of high conductivity can be appropriately used. For example, the wires may be obtained by patterning a laminate of a TaN film, Al or Cu film, and a Ti film layered in this order.

Figure 15H:
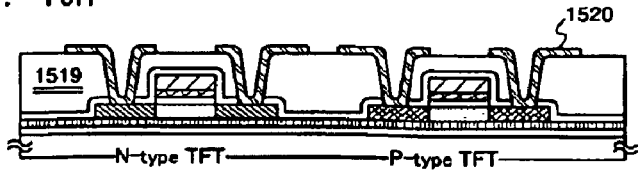

As has been described above, an n-channel TFT and a p-channel TFT each having a channel length of 6 μm and a channel width of 4 μm are formed (FIG. 15H).

Figure 16A:
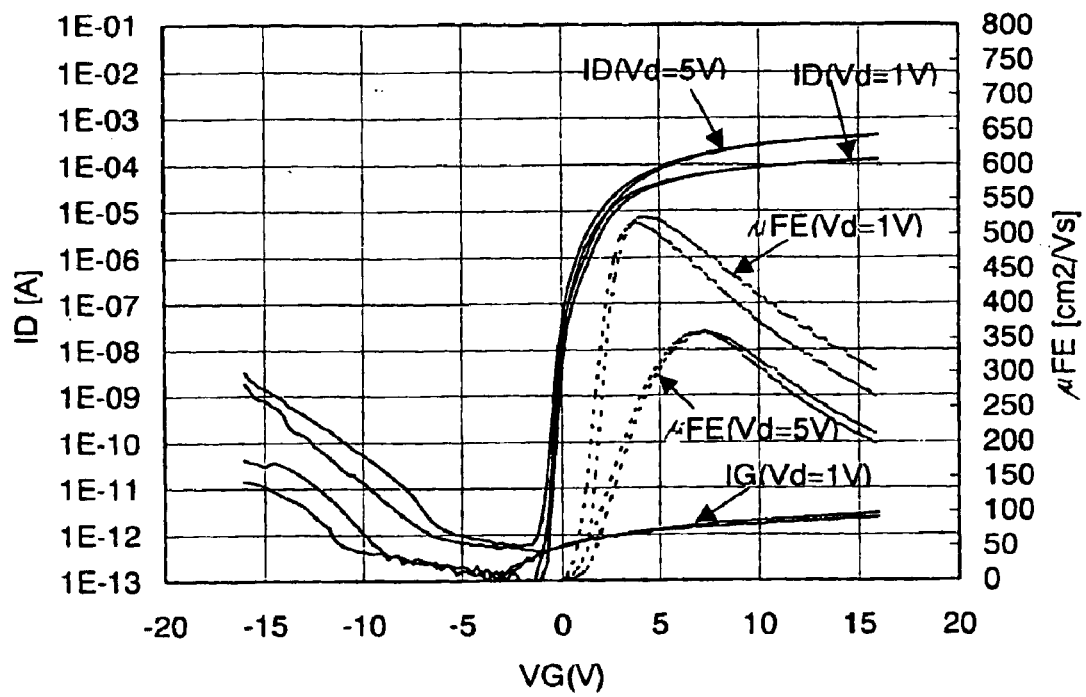
FIGS. 16A and 16B are diagrams showing results of measuring an electric characteristic of TFTs.
Figure 16B:
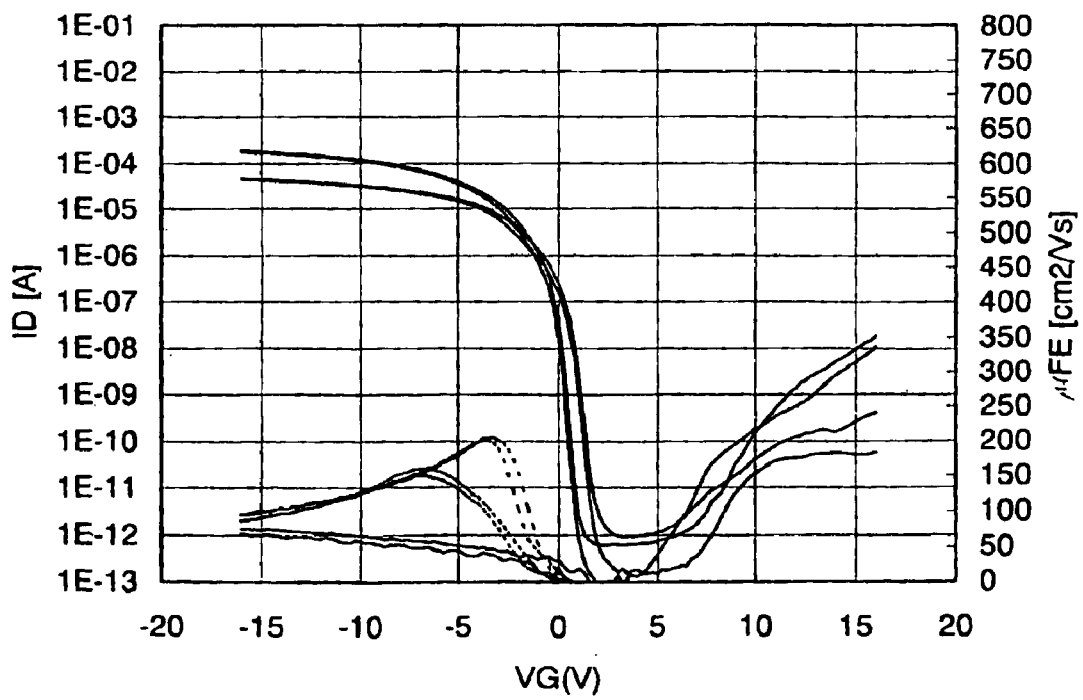

Electric characteristics of these TFTs are measured and the results are shown in FIGS. 16A and 16B. FIG. 16A shows electric characteristics of n-channel TFTs whereas FIG. 16B shows electric characteristics of p-channel TFTs. The measurement conditions include setting a gate-source voltage VG to −16 to 16 V and setting a source-drain voltage VD to ±1 V and ±5 V. In FIGS. 16A and 16B, a drain current ID and a gate leak current IG are indicated by solid lines and a field effect mobility μFE is indicated by a dotted line.

Crystal grains of large grain sizes are formed in a semiconductor layer crystallized in accordance with Embodiment 5. Therefore, a TFT using this semiconductor layer as an active layer has a very few grain boundaries in its channel formation region. Furthermore, the crystal grains formed extend in the laser scanning direction or neighboring direction and therefore electric charges pass a very few grain boundaries during their moving. This makes it possible to obtain TFTs having excellent electric characteristics as shown in FIGS. 16A to 16B. According to the results shown in FIGS. 16A and 16B, the field effect mobility is 524 $cm^2$/Vs for the n-channel TFTs and 205 $cm^2$/Vs for the p-channel TFTs. Thus the TFTs obtained have very excellent characteristics.

The TFTs manufactured in this embodiment are top gate TFTs. However, excellent characteristics can be obtained also when they are bottom gate TFTs, or dual gate TFTs in which gate electrodes are placed above and below active layers, for example, TFTs structured as described in Japanese Patent Application Nos. 2001-91493 and 2001-116307.

This embodiment may be combined with other embodiments.

Embodiment 8

This embodiment describes an example of manufacturing TFTs using as active layers a semiconductor layer that is crystallized by the process shown in Embodiment 6. The description is given with reference to FIGS. 17A to 17D.

Figure 17A:
FIGS. 17A to 17D are diagrams illustrating a process of manufacturing TFTs.

The procedure of forming a base film 1702 and an amorphous semiconductor layer 1703 on the substrate 1701 is the same as that of Embodiment 7. A silicon oxynitride film (composition ratio: Si=32%, O=27%, N=24%, H=17%) with a thickness of 50 nm and a silicon oxynitride film (composition ratio: Si=32%, O=59%, N=7%, H=2%) with a thickness of 100 nm are formed and layered by plasma CVD. On the base film 1702, an amorphous semiconductor layer 1703 with a thickness of 150 nm is formed by plasma CVD and then subjected to heat treatment at 500° C. for 3 hours to release hydrogen contained in the semiconductor layer (FIG. 17A).

Figure 17B:
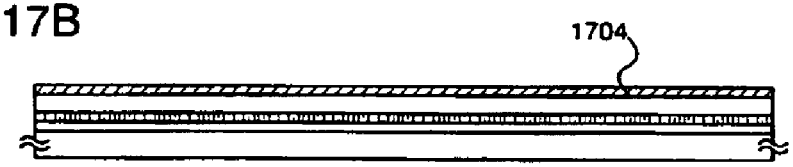
Figure 17C:
Figure 17D:
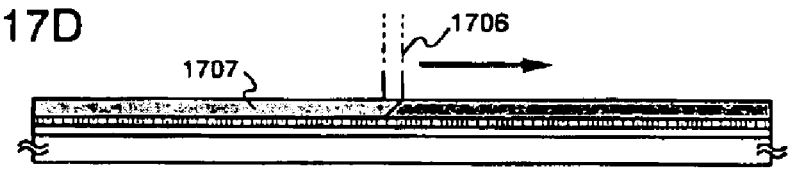

Then, using a method disclosed in JP 07-183540 A, a nickel acetate solution (concentration by weight: 5 ppm, 10 ml) is applied onto the amorphous semiconductor layer by spin coating to form a metal-containing layer 1704. Then, the substrate is subjected to heat treatment at 500° C. for an hour in a nitrogen atmosphere and at 550° C. for 12 hours in a nitrogen atmosphere. Thus obtained is a first crystalline semiconductor layer 1705 (FIG. 17C).

Subsequently, the crystallinity of the first crystalline semiconductor layer 1705 is improved by laser annealing.

The laser annealing conditions include using the second harmonic of a continuous wave $YVO_4$ laser (wavelength: 532 nm, 5.5 W) as a laser 1706 to scan and irradiate the entire surface of the first crystalline semiconductor layer 1705 for crystallization by the method shown in Embodiment 3 or 4. Thus obtained is a second crystalline semiconductor layer 1707 (FIG. 17B).

The subsequent steps are identical with those illustrated in FIGS. 15D to 15H in Embodiment 7. As a result, an n-channel TFT and a p-channel TFT each having a channel length of 6 μm and a channel width of 4 μm are formed.

Figure 18A:
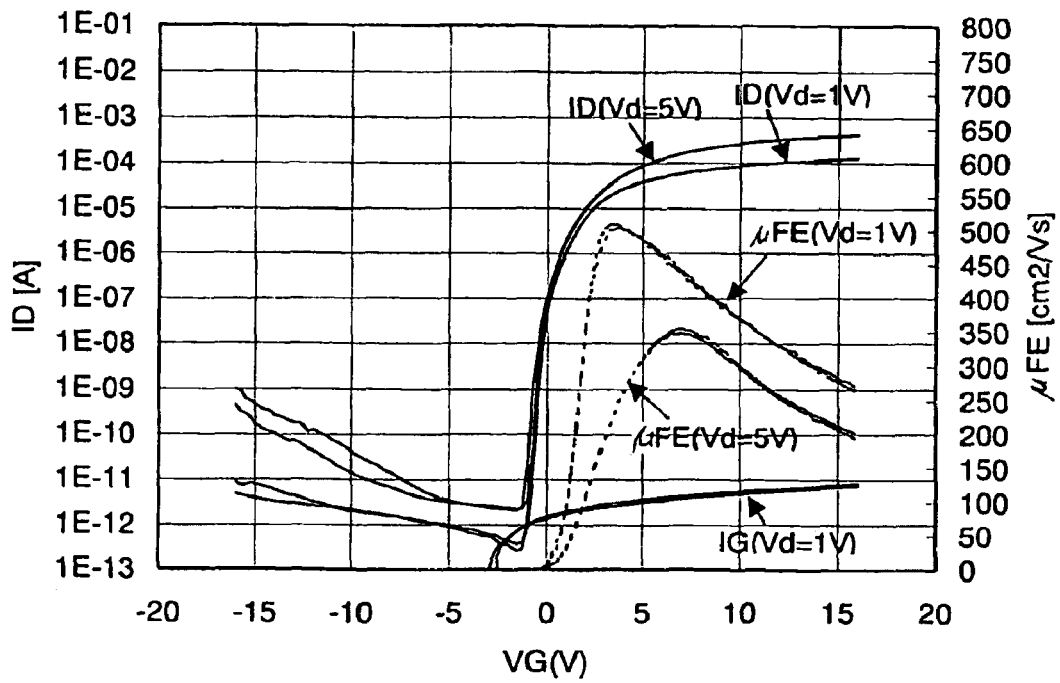
FIGS. 18A and 18B are diagrams showing results of measuring an electric characteristic of TFTs.
Figure 18B:
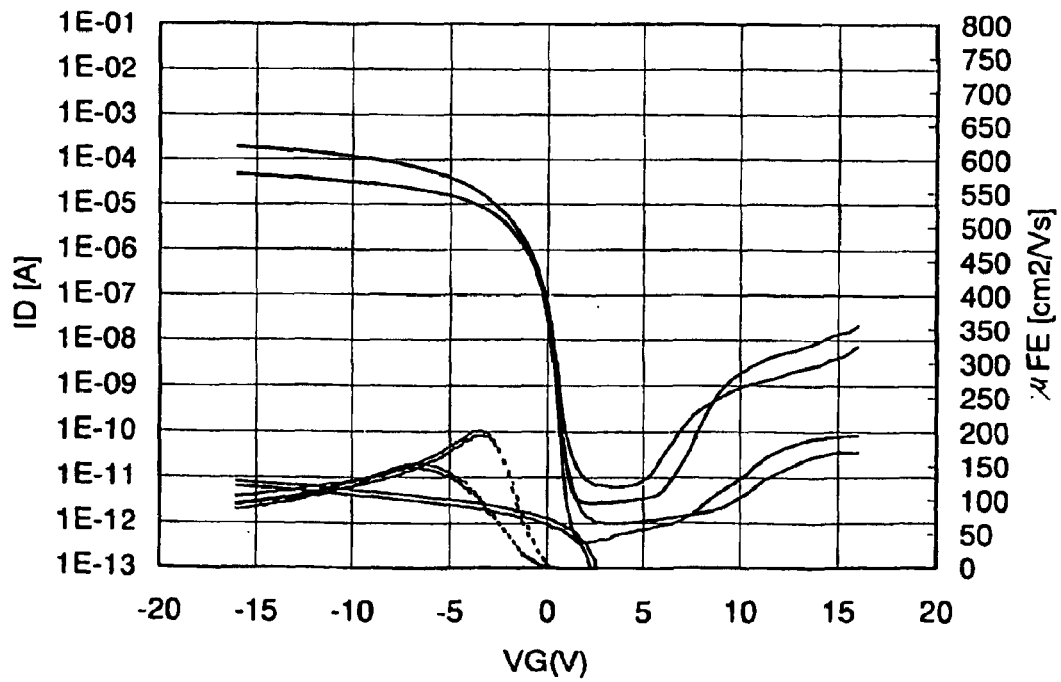
Figure 19A:
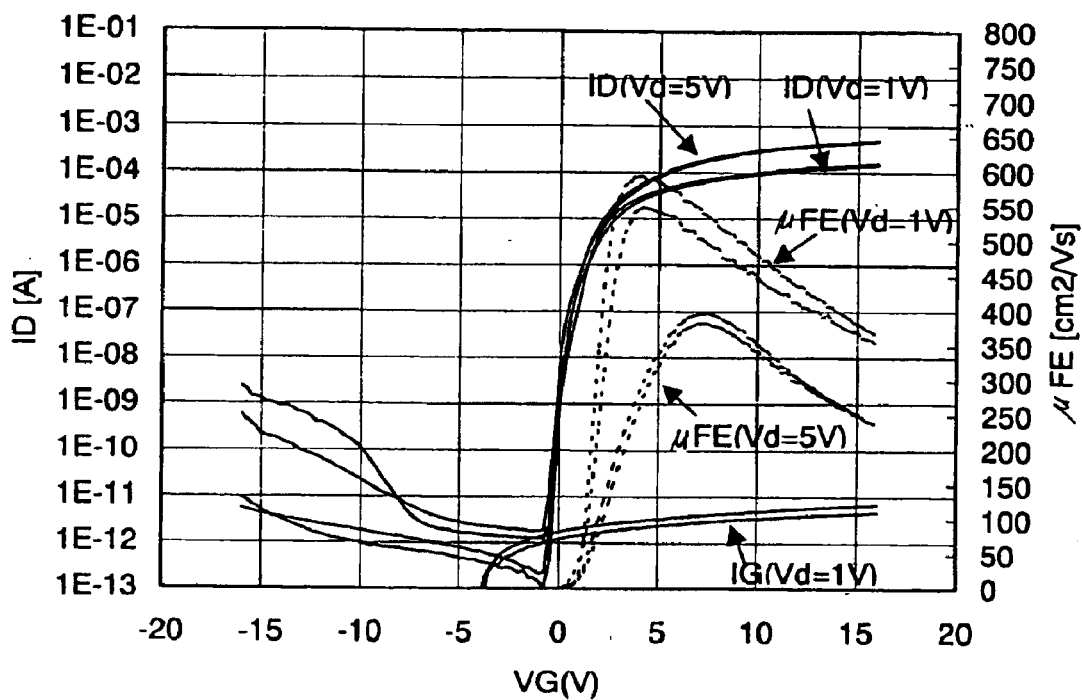
FIGS. 19A and 19B are diagrams showing results of measuring an electric characteristic of TFTs.
Figure 19B:
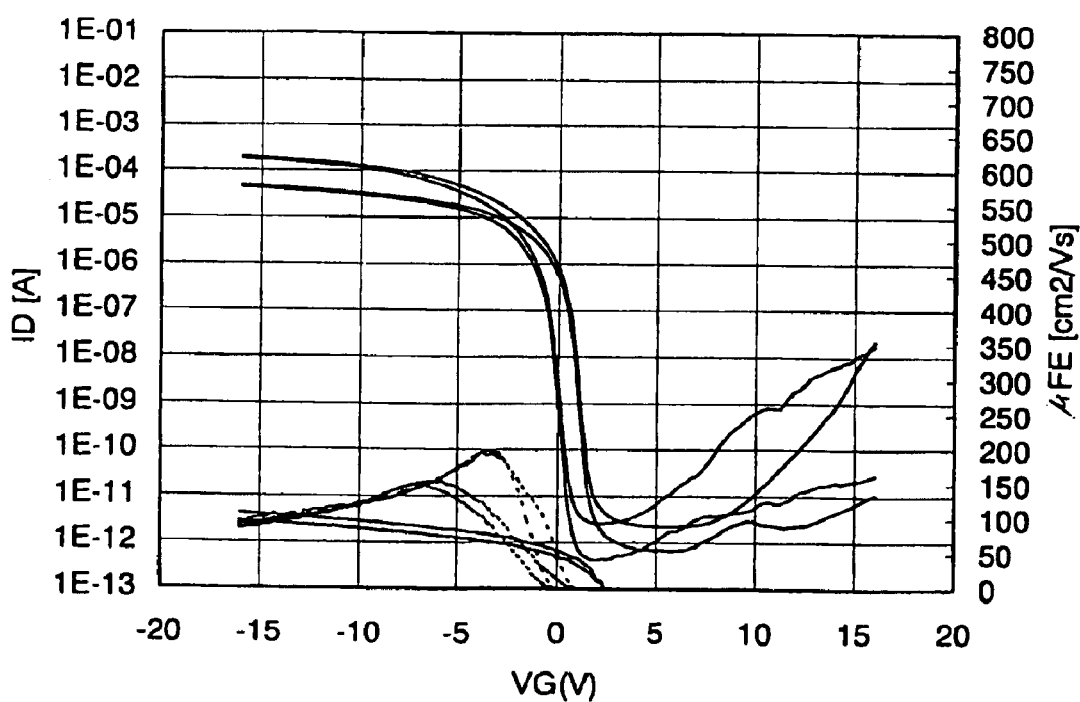

Electric characteristics of these TFTs are measured and the results are shown in FIGS. 18A to 19B. FIGS. 18A and 18B show electric characteristics of TFTs that are manufactured with the laser scan rate in the laser annealing step set to 20 cm/s whereas FIGS. 19A and 19B show electric characteristics of TFTs that are manufactured with the laser scan rate in the laser annealing step set to 50 cm/s. FIGS. 18A and 19A show electric characteristics of n-channel TFTs whereas FIGS. 18B and 19B show electric characteristics of p-channel TFTs. The measurement conditions include setting a gate-source voltage VG to −16 to 16 V and setting a source-drain voltage VD to ±1 V and ±5 V. In FIGS. 18A to 19B, a drain current ID and a gate leak current IG are indicated by solid lines and a field effect mobility μFE is indicated by a dotted line.

Crystal grains of large grain sizes are formed in a semiconductor layer crystallized in accordance with Embodiment 6. Therefore, a TFT using this semiconductor layer as an active layer has a very few grain boundaries in its channel formation region. Furthermore, the crystal grains formed extend in the laser scanning direction or neighboring direction and therefore electric charges pass a very few grain boundaries during their moving. This makes it possible to obtain TFTs having excellent electric characteristics as shown in FIGS. 18A to 19B. According to the results shown in FIGS. 18A and 18B, the field effect mobility is 510 $cm^2$/Vs for the n-channel TFTs and 200 $cm^2$/Vs for the p-channel TFTs. According to the results shown in FIGS. 19A and 19B, the field effect mobility is 595 $cm^2$/Vs for the n-channel TFTs and 199 $cm^2$/Vs for the p-channel TFTs. Thus, the TFTs obtained have very excellent characteristics.

Figure 20A:
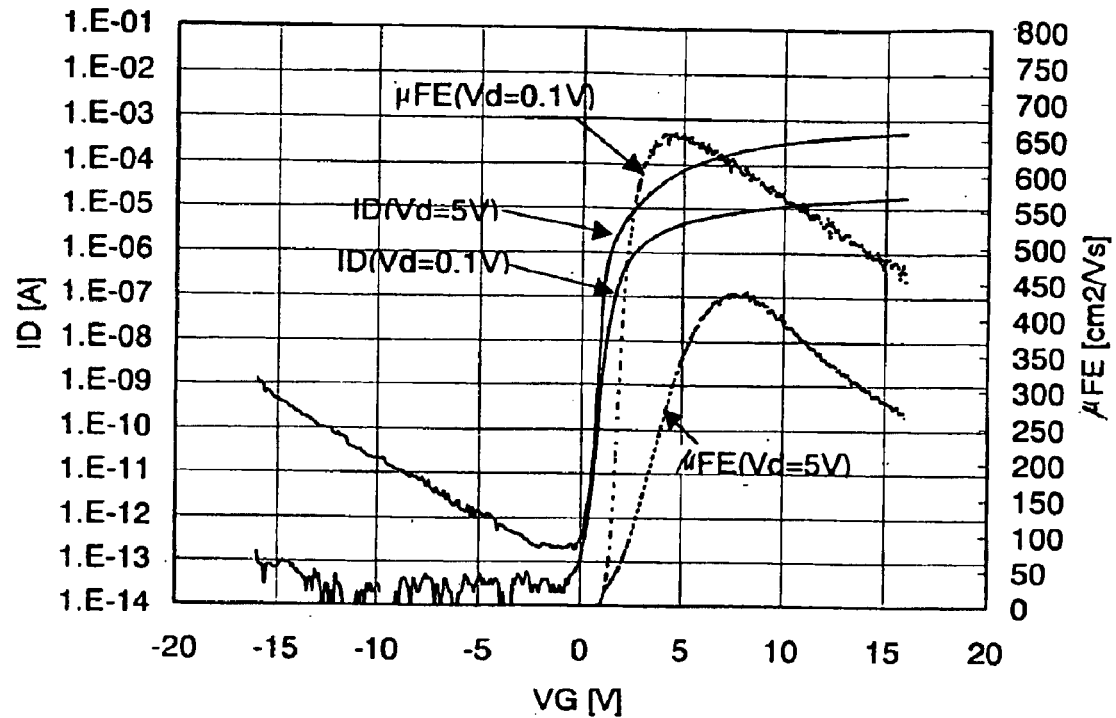
FIGS. 20A and 20B are diagrams showing results of measuring an electric characteristic of TFTs.
Figure 20B:
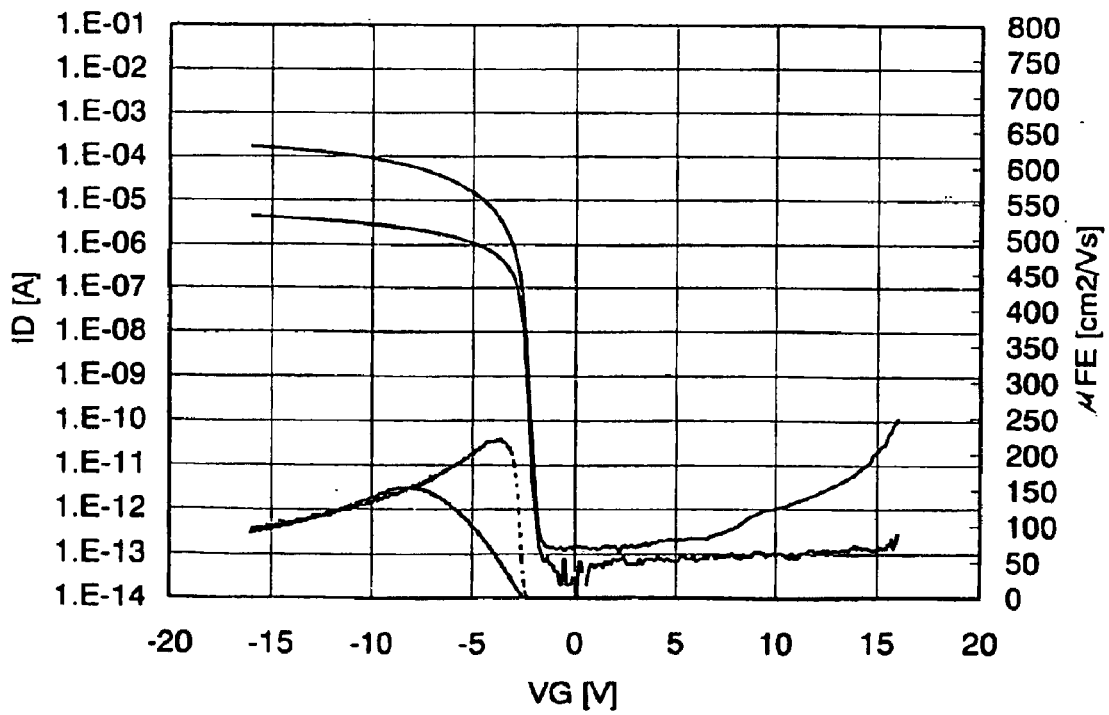

FIGS. 20A and 20B show results of measuring electric characteristics of TFTs that are manufactured with the laser scan rate set to 50 cm/s while setting the gate-source voltage VG to −16 to 16 V and the source-drain voltage VD to ±0.1 V and ±5 V. FIG. 20A shows electric characteristics of n-channel TFTs whereas FIG. 20B shows electric characteristics of p-channel TFTs. Their field effect mobility is particularly excellent and it is 657 $cm^2$/Vs for the n-channel TFTs and 219 $cm^2$/Vs for the p-channel TFTs.

The TFTs manufactured in this embodiment are top gate TFTs. However, excellent characteristics can be obtained also when they are bottom gate TFTs, or dual gate TFTs in which gate electrodes are placed above and below active layers, for example, TFTs structured as described in Japanese Patent Application Nos. 2001-91493 and 2001-116307.

This embodiment may be combined with other embodiments.

Embodiment 9

A driving circuit composed of a CMOS circuit is formed on the same substrate where a pixel portion having a switching TFT and a driving TFT is formed. This type of substrate is called an active matrix substrate for conveniences' sake. This embodiment describes a process of manufacturing a liquid crystal display device from an active matrix substrate defined as above. The description is given with reference to FIGS. 13A to 14D.

A substrate 5000 is a quartz substrate, silicon substrate, metal substrate, or stainless steel substrate with an insulating film formed on its surface. A plastic substrate may be employed if it has a heat resistance that can withstand treatment temperature in this manufacture process. In this embodiment, a substrate made of glass such as barium borosilicate glass or alumino borosilicate glass is used as the substrate 5000.

Following Embodiment 5 or 6, a base film 5001 and island-like crystalline semiconductor layers (hereinafter referred to as semiconductor layers) 5002 to 5005 are formed on the substrate 5000.

A gate insulating film 5006 is formed to cover the semiconductor layers 5002 to 5005. The gate insulating film 5006 is an insulating film containing silicon which is formed by plasma CVD or sputtering to have a thickness of 40 to 150 nm. In this embodiment, a silicon oxynitride film formed by plasma CVD to have a thickness of 115 nm is used as the gate insulating film 5006. The gate insulating film 5006 is not limited to the silicon oxynitride film and may be a single layer or a laminate of other insulating films containing silicon.

If a silicon oxide film is used as the gate insulating film 5006, it may be formed by plasma CVD using a mixture of TEOS (tetraethyl orthosilicate) and $O_2$ and setting the reaction pressure to 40 Pa, the substrate temperature to 300 to 400° C., and the high-frequency (13.56 MHz) power density to 0.5 to 0.8 $W/cm^2$ for electric discharge. The silicon oxide film formed as above can provide excellent characteristics as the gate insulating film 5006 if it is subjected to thermal annealing at 400 to 500° C.

On the gate insulating film 5006, a first conductive film 5007 with a thickness of 20 to 100 nm and a second conductive film 5008 with a thickness of 100 to 400 nm are layered. The first conductive film 5007 and the second conductive film 5008 in this embodiment are a TaN film with a thickness of 30 nm and a W film with a thickness of 370 nm, respectively.

In this embodiment, the TaN film that is the first conductive film 5007 is formed by sputtering using a Ta target in an atmosphere containing nitrogen. The W film that is the second conductive film 5008 is formed by sputtering using a W target. Alternatively, the W film may be formed by thermal CVD using tungsten hexafluoride ($WF_6$). In either case, the W film has to have a low resistivity in order to use it for gate electrodes and the resistivity of the W film is desirably 20 μΩcm or less. Although the resistivity of the W film can be lowered by increasing crystal grains in size, too many impurity elements such as oxygen in the W film hinder crystallization and raise the resistivity. Accordingly, the W film in this embodiment is formed by sputtering using a highly pure W target (purity: 99.9999%) and taking care not to allow impurities from the air to mix in the film during formation. As a result, the resistivity is reduced down to 9 to 20 μΩcm.

Although the first conductive film 5007 is a TaN film and the second conductive film 5008 is a W film in this embodiment, there are no particular limitations on the materials of the first conductive film 5007 and the second conductive film 5008. The first conductive film 5007 and the second conductive film 5008 may be formed from elements selected from the group consisting of Ta, W, Ti, Mo, Al, Cu, Cr, and Nd, or alloy materials or compound materials mainly containing the elements listed above. The conductive films may also be formed from a semiconductor film, typically a polycrystalline silicon film doped with phosphorus or other impurity elements, or from an Ag—Pd—Cu alloy.

Figure 13A:
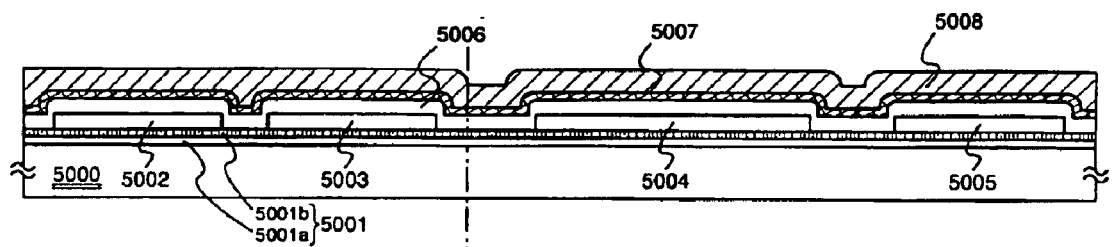
FIGS. 13A to 13D are diagrams illustrating a process of manufacturing a liquid crystal display device.
Figure 13B:
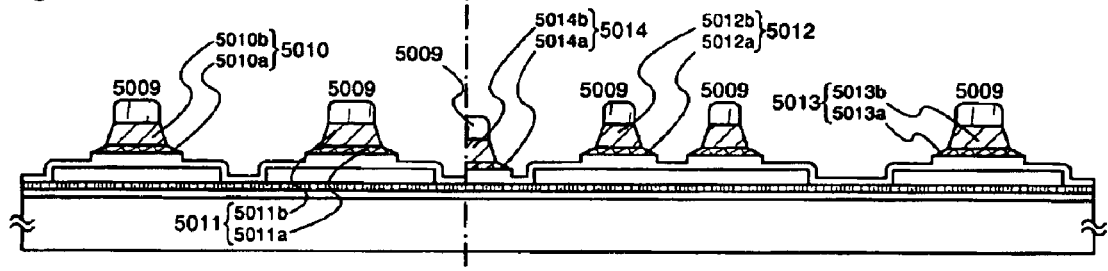

Next, a resist mask 5009 is formed by photolithography to conduct first etching treatment for forming electrodes and wires. First and second etching conditions are used in the first etching treatment (FIG. 13B).

In this embodiment, the first etching conditions include employing ICP (inductively coupled plasma) etching, using as etching gas $CF_4$, $Cl_2$, and $O_2$, setting the gas flow rate ratio thereof to 25:25:10 (unit: sccm), and giving an RF (13.56 MHz) power of 500 W to a coiled electrode at a pressure of 1.0 Pa to generate plasma. The substrate side (sample stage) also receives an RF (13.56 MHz) power of 150 W so that a substantially negative self-bias voltage is applied. Under these first etching conditions, the W film is etched to taper the edges of the first conductive layer 5007.

The first etching conditions are switched to the second etching conditions without removing the resist mask 5009. The second etching conditions include using as etching gas $CF_4$ and $Cl_2$, setting the gas flow rate ratio thereof to 30:30 (unit: sccm), and giving an RF (13.56 MHz) power of 500 W to a coiled electrode at a pressure of 1.0 Pa to generate plasma for etching for about 15 seconds. The substrate side (sample stage) also receives an RF (13.56 MHz) power of 20 W so that a substantially negative self-bias voltage is applied. Under the second etching conditions, the first conductive layer 5007 and the second conductive layer 5008 are etched to the same degree. In order to avoid leaving any residue on the gate insulating film 5006 after etching, the etching time is prolonged by 10 to 20%.

In the first etching treatment described above, the first conductive layer 5007 and the second conductive layer 5008 are tapered around their edges by the effect of the bias voltage applied to the substrate side if the resist mask is properly shaped. Thus obtained through the first etching treatment are first shape conductive layers 5010 to 5014 that are formed from the first conductive layer 5007 and the second conductive layer 5008. Regions of the gate insulating film 5006 that are not covered with the first shape conductive layers 5010 to 5014 are etched by 20 to 50 nm to form thinned regions.

Figure 13C:
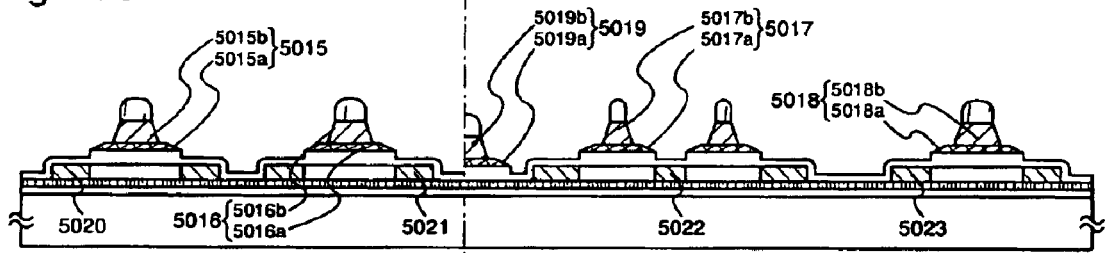
Figure 13D:
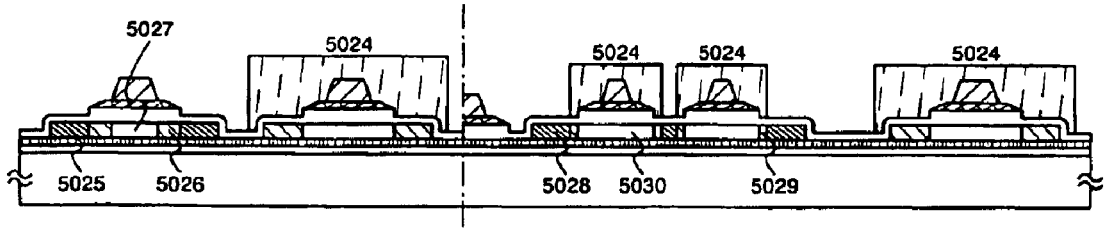

Next, second etching treatment is conducted without removing the resist mask 5009 (FIG. 13C). In the second etching treatment, $SF_6$, $Cl_2$, and $O_2$ are used as etching gas, the gas flow rate ratio thereof are set to 24:12:24 (unit: sccm), and an RF (13.56 MHz) power of 700 W is given to a coiled electrode at a pressure of 1.3 Pa to generate plasma for etching for about 25 seconds. The substrate side (sample stage) also receives an RF (13.56 MHz) power of 10 W so that a substantially negative self-bias voltage is applied. The W film is thus selectively etched to form second shape conductive layers 5015 to 5019. In the second etching treatment, first conductive layers 5015a to 5018a are hardly etched.

Then, without removing the resist mask 5009, first doping treatment is conducted to dope the semiconductor layers 5002 to 5005 with a low concentration of impurity element that imparts the n type conductivity. The first doping treatment employs ion doping or ion implantation. Ion doping conditions include setting the dose to $1\times10^{13}$ to $5\times10^{14}$ atoms/$cm^2$ and the acceleration voltage to 40 to 80 keV. In this embodiment, the dose is set to $5.0\times10^{13}$ atoms/$cm^2$ and the acceleration voltage is set to 50 keV for ion doping. The impurity element used to impart the n type impurity is an element belonging to Group 15, typically, phosphorus (P) or arsenic (As). Phosphorus is used in this embodiment. In the first doping treatment, the second shape conductive layers 5015 to 5019 serve as masks against the impurity element that imparts the n type conductivity and first impurity regions (n-regions) 5020 to 5023 are formed in a self-aligning manner. The first impurity regions 5020 to 5023 are doped with the impurity element that gives the n type conductivity in a concentration of $1\times10^{18}$ to $1\times10^{20}$ atoms/$cm^3$.

Subsequently, the resist mask 5009 is removed and a new resist mask 5024 is formed for second doping treatment. The acceleration voltage in the second doping treatment is higher than in the first doping treatment. This time, ion doping conditions include setting the dose to $1\times10^{13}$ to $3\times10^{15}$ atoms/cm$^2$ and the acceleration voltage to 60 to 120 keV. In this embodiment, the dose is set to $3.0\times10^{15}$ atoms/cm$^2$ and the acceleration voltage is set to 65 keV. The second doping treatment uses the second conductive layers 5015b to 5018b as masks against the impurity element so that the semiconductor layers below the tapered portions of the first conductive layers 5015a to 5018a are doped with the impurity element.

As a result of the second doping treatment, second impurity regions (n– regions, Lov regions) 5026 overlapping the first conductive layers are doped with the impurity element that imparts the n type conductivity in a concentration of $1\times10^{18}$ to $5\times10^{19}$ atoms/cm$^3$. Third impurity regions (n+ regions) 5025 and 5028 are also doped with the impurity element that imparts the n type conductivity in a concentration of $1\times10^{19}$ to $5\times10^{21}$ atoms/cm$^3$. After the first and second doping treatment, the semiconductor layers 5002 to 5005 have regions that are not doped with an impurity element at all or regions that are doped with a minute amount of impurity element. The regions that are not doped with an impurity element at all or regions that are doped with a minute amount of impurity element are called channel regions 5027 and 5030 in this embodiment. Of the first impurity regions (n– regions) 5020 to 5023 formed by the first doping treatment, regions that are covered with the resist 5024 during the second doping treatment are still first impurity regions (n– regions, LDD regions) and denoted by 5029 in this embodiment.

Although the second impurity regions (n– regions) 5026 and the third impurity regions (n+ regions) 5025 and 5028 are formed by the second doping treatment alone in this embodiment, this is not the only way. The regions may be formed by plural doping treatment changing the doping conditions suitably.

Figure 14A:
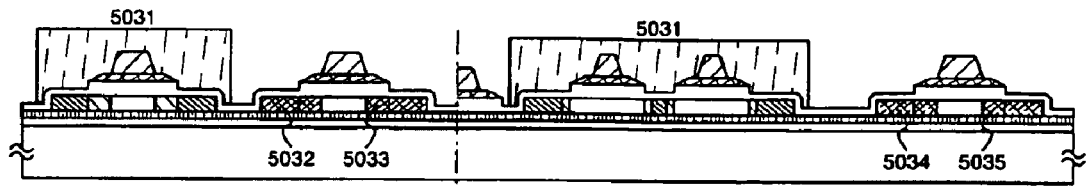
FIGS. 14A to 14D are diagrams illustrating a process of manufacturing a liquid crystal display device.

Next, the resist mask 5024 is removed and a new resist mask 5031 is formed as shown in FIG. 14A for third doping treatment. Through the third doping treatment, fourth impurity regions (p+ regions) 5032 and 5034 and fifth impurity regions (p– regions) 5033 and 5035 doped with an impurity element having the opposite conductivity to the n type conductivity are formed in semiconductor layers that are to serve as active layers of p-channel TFTs.

In the third doping treatment, the second conductive layers 5016b and 5018b are used as masks against the impurity element. The fourth impurity regions (p+ regions) 5032 and 5034 and fifth impurity regions (p– regions) 5033 and 5035 doped with an impurity element that imparts the p type conductivity are thus formed in a self-aligning manner.

The fourth impurity regions 5032 and 5034 and the fifth impurity regions 5033 and 5035 in this embodiment are formed by ion doping using diborane (B$_2$H$_6$). The ion doping conditions include setting the dose to $1\times10^{16}$ atoms/cm$^2$ and the acceleration voltage to 80 keV.

During the third doping treatment, semiconductor layers for forming n-channel TFTs are covered with the resist mask 5031.

The fourth impurity regions (p+ regions) 5032 and 5034 and the fifth impurity regions (p– regions) 5033 and 5035 have been doped with phosphorus in different concentrations by the first and second doping treatment. However, through the third doping treatment, any region of the fourth impurity regions (p+ regions) 5032 and 5034 and of the fifth impurity regions (p– regions) 5033 and 5035 are doped with the impurity element that imparts the p type conductivity in a concentration of $1\times10^{19}$ to $5\times10^{21}$ atoms/cm$^3$. Therefore, the fourth impurity regions (p+ regions) 5032 and 5034 and the fifth impurity regions (p– regions) 5033 and 5035 can function as source regions and drain regions of p-channel TFTs without problems.

Although the fourth impurity regions (p+ regions) 5032 and 5034 and the fifth impurity regions (p– regions) 5033 and 5035 are formed by the third doping treatment alone in this embodiment, this is not the only way. The regions may be formed by plural doping treatment changing the doping conditions suitably.

Figure 14B:
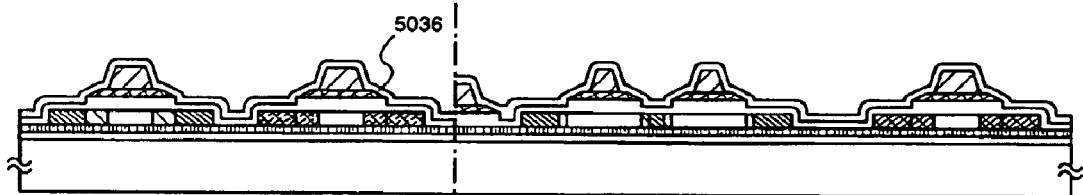

Next, the resist mask 5031 is removed and a first interlayer insulating film 5036 is formed as shown in FIG. 14B. The first interlayer insulating film 5036 is an insulating film containing silicon which is formed by plasma CVD or sputtering to have a thickness of 100 to 200 nm. In this embodiment, a silicon oxynitride film is formed by plasma CVD to have a thickness of 100 nm. The first interlayer insulating film 5036 is not limited to the silicon oxynitride film and may be a single layer or a laminate of other insulating films containing silicon.

Figure 14C:
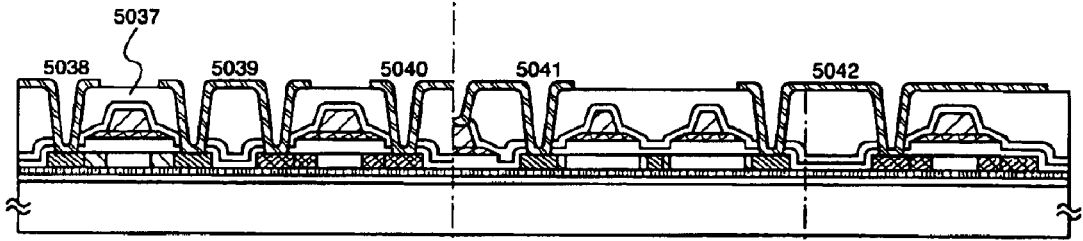

Then, heat treatment is conducted to restore the crystallinity of the semiconductor layers and activate the impurity elements used to dope the semiconductor layers as shown in FIG. 14C. The heat treatment is achieved by thermal annealing using an annealing furnace. For the thermal annealing, a nitrogen atmosphere containing 1 ppm of oxygen or less, preferably 0.1 ppm or less, is used and the temperature is set to 400 to 700° C. In this embodiment, the impurity elements are activated by heat treatment at 410° C. for an hour. Other than thermal annealing, laser annealing or rapid thermal annealing (RTA) may be employed.

The heat treatment may precede formation of the first interlayer insulating film 5036. However, if the materials forming the first conductive layers 5015a to 5019a and the second conductive layers 5015b to 5019b are weak against heat, it is preferable to conduct the heat treatment after the first interlayer insulating film 5036 (an insulating film mainly containing silicon, for example, a silicon nitride film) is formed as in this embodiment because wires and the like are protected this way.

By heat treatment following formation of the first interlayer insulating film 5036 (an insulating film mainly containing silicon, for example, a silicon nitride film), the semiconductor layers are hydrogenated at the same time the impurity elements are activated. In the hydrogenation process, dangling bonds in the semiconductor layers are terminated by hydrogen contained in the first interlayer insulating film 5036.

Alternatively, the hydrogenation and activation may be achieved by separate heat treatment.

The semiconductor layers can be hydrogenated irrespective of whether the first interlayer insulating film 5036 is present or not. Other hydrogenation measures include plasma hydrogenation using hydrogen that is excited by plasma and heat treatment in an atmosphere containing 3 to 100% of hydrogen at 300 to 450° C. for 1 to 12 hours.

Next, a second interlayer insulating film 5037 is formed on the first interlayer insulating film 5036. An inorganic insulating film can be used as the second interlayer insulating film 5037. For example, a silicon oxide film formed by CVD or silicon oxide film obtained through application by SOG (slip on glass), or the like can be used. The second interlayer insulating film 5037 may be an organic insulating film instead. For instance, films of polyimide, polyamide, BCB (benzocyclobutene), acrylic, etc. can be used. A laminate of an acrylic film and a silicon oxynitride film may also be used.

In this embodiment, an acrylic film with a thickness of 1.6 µm is formed as the second interlayer insulating film. The second interlayer insulating film 5037 reduces inequalities caused by the TFTs formed on the substrate 5000 and levels the surface. Since the major role of the second interlayer insulating film 5037 is planarization, a film capable of leveling the surface well is preferred as the second interlayer insulating film.

The second interlayer insulating film 5037, the first interlayer insulating film 5036, and the gate insulating film 5006 are etched by dry etching or wet etching to form contact holes that reach the third impurity regions 5025 and 5028 and the fourth impurity regions 5032 and 5034.

Subsequently, wires 5038 to 5041 electrically connected to the impurity regions and a pixel electrode 5042 are formed. The wires are obtained by patterning a laminate of a Ti film with a thickness of 50 nm and an Al—Ti alloy film with a thickness of 500 nm. Instead of a two-layer structure, a single-layer structure or a multi-layer structure having three or more layers may be employed. The wire materials are not limited to Al and Ti. For example, the wires may be formed by patterning a laminate of a TaN film, an Al film or a Cu film, and a Ti film which are layered in this order. Desirably, materials having excellent reflectivity are used for the wires.

On a region including at least the pixel electrode 5042, an oriented film 5043 is formed and subjected to rubbing treatment. In this embodiment, columnar spacers 5045 for keeping the distance between substrates are formed at desired positions by patterning an organic resin film such as an acrylic resin film before forming the oriented film 5043. Instead of columnar spacers, spherical spacers may be sprayed onto the entire surface of the substrate.

Next, an opposite substrate 5046 is prepared. Color layers (color filters) 5047 to 5049 and a planarization film 5050 are formed on the opposite substrate 5046. At this point, the first color layer 5047 and the second color layer 5048 overlap each other to form a light-shielding portion. The first color layer 5047 and the third color layer 5049 may partially overlap to form a light-shielding portion, or the second color layer 5048 and the third color layer 5049 may partially overlap to form a light-shielding portion.

The number of manufacture steps is thus reduced by shielding gaps between pixels against light with a laminate of color layers instead of newly forming a light-shielding layer.

Next, an opposite electrode 5051 is formed from a transparent conductive film on the planarization film 5050 in at least a pixel portion. An oriented film 5052 is formed on the entire surface of the opposite substrate and is subjected to rubbing treatment.

Figure 14D:
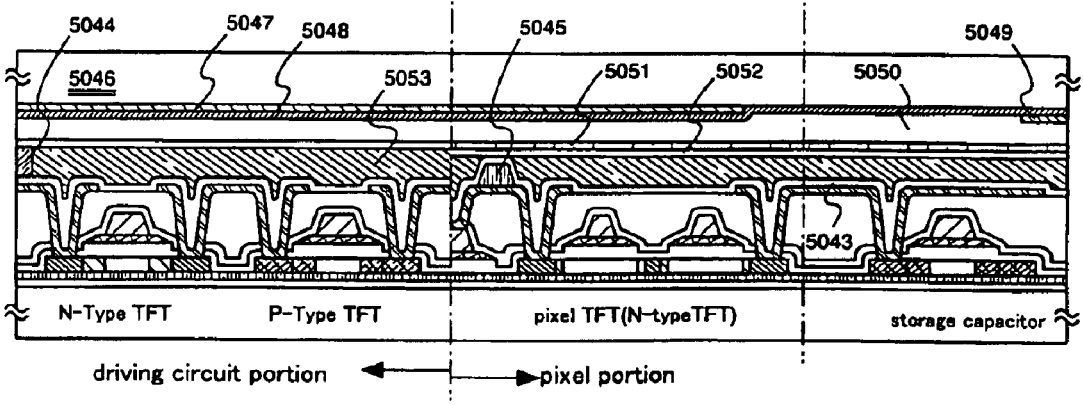

Then, the active matrix substrate on which the pixel portion and the driving circuit are formed is bonded to the opposite substrate with a seal member 5044. The seal member 5044 has a filler mixed therein and the filler, together with the columnar spacers, keeps the gap between the two substrates uniform while they are bonded to each other. Thereafter, a liquid crystal material 5053 is injected between the substrates and a sealing agent (not shown in the drawing) is used to seal the substrates. A well-known liquid crystal material may be used for the liquid crystal material 5053. Thus, the liquid crystal display device shown in FIG. 14D is completed. If necessary, the active matrix substrate or the opposite substrate is cut into desired shapes. Then, a polarizing plate and an FPC (not shown in the drawing) are bonded to the device.

The liquid crystal display device manufactured as above has TFTs formed from semiconductor films that have crystal grains of large grain sizes, and this gives the liquid crystal display device satisfactory operation characteristics and reliability. The liquid crystal display device as such can be used as a display unit in various electronic equipment.

This embodiment may be combined with other embodiments.

Embodiment 10

The present invention is not limited to a liquid crystal display device, the present invention also is possible to be applied to manufacture of a light emitting device in which an EL (electro luminescence) is used as a light emitting element. Examples of manufacturing such a light emitting device is described in this embodiment along FIG. 14 in part and FIG. 21.

In accordance with FIG. 9, after a state shown in FIG. 14B is obtained, a second interlayer insulating film 6001 is formed on the first interlayer insulating film 5036. An inorganic insulating film can be used as the second interlayer insulating film 6001. For example, a silicon oxide film formed by a CVD method, a silicon oxide film applied by an SOG (spin on glass) method, or the like can be used. In addition, an organic insulating film can be used as the second interlayer insulating film 6001. For example, a film made of polyimide, polyamide, BCB (benzocyclobutene), acrylic, or the like can be used. Further, a laminate structure of an acrylic film and a silicon oxynitride film may be used.

In this embodiment, an acrylic film having a film thickness of 1.6 µm is formed. When the second interlayer insulating film 6001 is formed, unevenness caused by TFTs formed on the substrate 5000 is reduced and the surface can be leveled. In particular, the second interlayer insulating film 6001 has a strong sense of leveling. Thus, a film having superior evenness is preferable.

Next, using dry etching or wet etching, the second interlayer insulating film 6001, the first interlayer insulating film 5036, and the gate insulating film 5006 are etched to form contact holes which reach the third impurity regions 5025 and 5028 and the fourth impurity regions 5032 and 5034.

Next, a pixel electrode 6002 made from a transparent conductive film is formed. A compound of indium oxide and tin oxide (indium tin oxide: ITO), a compound of indium oxide and zinc oxide, zinc oxide, tin oxide, indium oxide, or the like can be used for the transparent conductive film. In addition, the transparent conductive film to which gallium is added may be used. The pixel electrode corresponds to the anode of an EL element.

In this embodiment, an ITO film is formed at a thickness of 110 nm and then patterned to form the pixel electrode 6002.

Next, wirings 6003 to 6009 electrically connected with the respective impurity regions are formed. Note that, in this embodiment, a Ti film having a film thickness of 100 nm, an Al film having a film thickness of 350 nm, and a Ti film having a film thickness of 100 nm are formed into a laminate in succession by a sputtering method and a resultant laminate film is patterned in a predetermined shape so that the wirings 6003 to 6009 are formed.

Of course, they are not limited to a three-layer structure. A single layer structure, a two-layer structure, or a laminate structure composed of four layers or more may be used. Materials of the wirings are not limited to Al and Ti, and therefore other conductive films may be used. For example, an Al film or a Cu film is formed on a TaN film, a Ti film is formed thereon, and then a resultant laminate film is patterned to form the wirings.

Figure 21A:
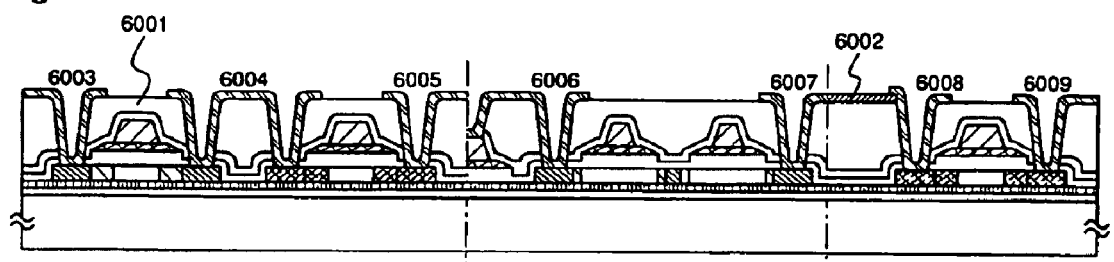
FIGS. 21A and 21B are diagrams illustrating a process of manufacturing a light emitting device.

By the above steps, as shown in FIG. 21A, the driver circuit portion including the CMOS circuit composed of the N-channel TFT and the P-channel TFT and the pixel portion including the switching TFT and the drive TFT can be formed on the same substrate.

Next, a third interlayer insulating film 6010 is formed. An inorganic insulating film or an organic insulating film can be used as the third interlayer insulating film 6010. A silicon oxide film formed by a CVD method, a silicon oxide film applied by an SOG (spin on glass) method, a silicon oxynitride film formed by a sputtering method, or the like can be used as the inorganic insulating film. In addition, an acrylic resin film or the like can be used as the organic insulating film.

Examples of a combination of the second interlayer insulating film 6001 and the third interlayer insulating film 6010 will be described below.

There is a combination in which a laminate film of an acrylic film and a silicon oxynitride film formed by a sputtering method is used as the second interlayer insulating film 6001 and a silicon oxynitride film formed by a sputtering method is used as the third interlayer insulating film 6010. In addition, there is a combination in which a silicon oxide film formed by an SOG method is used as the second interlayer insulating film 6001 and a silicon oxide film formed by an SOG method is used as the third interlayer insulating film 6010. In addition, there is a combination in which a laminate film of a silicon oxide film formed by an SOG method and a silicon oxide film formed by a plasma CVD method is used as the second interlayer insulating film 6001 and a silicon oxide film formed by a plasma CVD method is used as the third interlayer insulating film 6010. In addition, there is a combination in which acrylic is used for the second interlayer insulating film 6001 and acrylic is used for the third interlayer insulating film 6010. In addition, there is a combination in which a laminate film of an acrylic film and a silicon oxide film formed by a plasma CVD method is used as the second interlayer insulating film 6001 and a silicon oxide film formed by a plasma CVD method is used as the third interlayer insulating film 6010. In addition, there is a combination in which a silicon oxide film formed by a plasma CVD method is used as the second interlayer insulating film 6001 and acrylic is used for the third interlayer insulating film 6010.

Figure 21B:
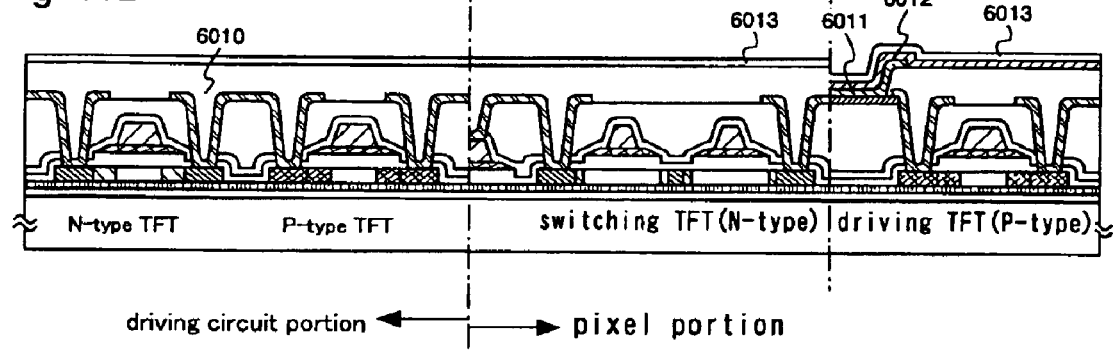

Next, as shown in FIG. 21B, an opening portion is formed at a position corresponding to the pixel electrode 6002 in the third interlayer insulating film 6010. The third interlayer insulating film 6010 serves as a bank. When a wet etching method is used at the formation of the opening portion, it can be easily formed as a side wall having a taper shape. If the side wall of the opening portion is not sufficiently gentle, the deterioration of an EL layer by a step becomes a marked problem. Thus, attention is required.

A carbon particle or a metallic particle may be added into the third interlayer insulating film to reduce resistivity, thereby suppressing the generation of static electricity. At this time, the amount of carbon particle or metallic particle to be added is preferably adjusted such that the resistivity becomes $1\times10^6$ Ωm to $1\times10^{12}$ Ωm (preferably, $1\times10^8$ Ωm to $1\times10^{10}$ Ωm).

Next, an EL layer 6011 is formed on the pixel electrode 6002 exposed in the opening portion of the third interlayer insulating film 6010.

Public known organic light emitting materials or inorganic light emitting materials can be used as the EL layer 6011.

A low molecular weight based organic light emitting material, a polymer molecular weight based organic light emitting material, or a medium molecular weight based organic light emitting material can be freely used as the organic light emitting material. Note that in this specification, a medium molecular weight based organic light emitting material indicates an organic light emitting material which has no sublimation property and in which the number of molecules is 20 or less or a length of chained molecules is 10 µm or less.

The EL layer 6011 has generally a laminate structure. Typically, there is a laminate structure of "a hole transporting layer, a light emitting layer, and an electron transporting layer", which has been proposed by Tang et al. in Eastman Kodak Company. In addition to this, a structure in which "a hole injection layer, a hole transporting layer, a light emitting layer, and an electron transporting layer" or "a hole injection layer, a hole transporting layer, a light emitting layer, an electron transporting layer, and an electron injection layer" are laminated on an anode in this order may be used. A light emitting layer may be doped with fluorescent pigment or the like.

In this embodiment, the EL layer 6011 is formed by an evaporation method using a low molecular weight based organic light emitting material. Specifically, a laminate structure in which a copper phthalocyanine (CuPc) film having a thickness of 20 nm is provided as the hole injection layer and a tris-8-quinolinolato aluminum complex (Alq$_3$) film having a thickness of 70 nm is provided thereon as the light emitting layer is used. A light emission color can be controlled by adding fluorescent pigment such as quinacridon, perylene, or DCM1 to Alq$_3$.

Note that only one pixel is shown in FIG. 21B. However, a structure in which the EL layers 6011 corresponding to respective colors of, plural colors, for example, R (red), G (green), and B (blue) are separately formed can be used.

Also, as an example using the polymer molecular weight based organic light emitting material, the EL layer 6011 may be constructed by a laminate structure in which a polythiophene (PEDOT) film having a thickness of 20 nm is provided as the hole injection layer by a spin coating method and a paraphenylenevinylene (PPV) film having a thickness of about 100 nm is provided thereon as the light emitting layer. When π conjugated system polymer of PPV is used, a light emission wavelength from red to blue can be selected. In addition, an inorganic material such as silicon carbide can be used as the electron transporting layer and the electron injection layer.

Note that the EL layer 6011 is not limited to a layer having a laminate structure in which the hole injection layer, the hole transporting layer, the light emitting layer, the electron transporting layer, the electron injection layer, and the like are distinct. In other words, the EL layer 6011 may have a laminate structure with a layer in which materials composing the hole injection layer, the hole transporting layer, the light emitting layer, the electron transporting layer, the electron injection layer, and the like are mixed.

For example, the EL layer 6011 may have a structure in which a mixed layer composed of a material composing the electron transporting layer (hereinafter referred to as an electron transporting material) and a material composing the light emitting layer (hereinafter referred to as a light emitting material) is located between the electron transporting layer and the light emitting layer.

Next, a pixel electrode 6012 made from a conductive film is provided on the EL layer 6011. In the case of this embodiment, an alloy film of aluminum and lithium is used as the conductive film. Of course, a known MgAg film (alloy film of magnesium and silver) may be used. The pixel electrode 6012 corresponds to the cathode of the EL element. A conductive film made of an element that belongs to Group 1 or Group 2 of the periodic table or a conductive film to which those elements are added can be freely used as a cathode material.

When the pixel electrode 6012 is formed, the EL element is completed. Note that the EL element indicates an element composed of the pixel electrode (anode) 6002, the EL layer 6011, and the pixel electrode (cathode) 6012.

It is effective that a passivation film 6013 is provided to completely cover the EL element. A single layer of an insulating film such as a carbon film, a silicon nitride film, or a silicon oxynitride film, or a laminate layer of a combination thereof can be used as the passivation film 6013.

It is preferable that a film having good coverage is used as the passivation film 6013, and it is effective to use a carbon film, particularly, a DLC (diamond like carbon) film and a CN film. The DLC film can be formed at a temperature range of from a room temperature to 100° C. Thus, a film can be easily formed over the EL layer 6011 having a low heat-resistance. In addition, the DLC film has a high blocking effect to oxygen so that the oxidization of the EL layer 6011 can be suppressed. Therefore, a problem in which the EL layer 6011 is oxidized can be prevented.

Note that, it is effective that steps up to the formation of the passivation film 6013 after the formation of the third interlayer insulating film 6010 are conducted in succession using a multi-chamber type (or in-line type) film formation apparatus without being exposed to air.

Note that, actually, when it is completed up to the state shown in FIG. 21B, in order not to be exposed to air, it is preferable that packaging (sealing) is conducted using a protective film (laminate film, ultraviolet curable resin film, or the like) or a transparent sealing member which has a high airtight property and low degassing. At this time, when an inner portion surrounded by the sealing member is made to an inert atmosphere or a hygroscopic material (for example, barium oxide) is located in the inner portion, the reliability of the EL element is improved.

Also, after an airtightness level is increased by processing such as packaging, a connector (flexible printed circuit: FPC) for connecting terminals led from elements or circuits which are formed on the substrate 5000 with external signal terminals is attached so that it is completed as a product.

Note that in this embodiment, the EL element is formed in order of an anode (a transparent electrode), an EL layer (a hole injection layer, a hole transporting layer, a light emitting layer, an electron transporting layer, an electron injection layer), and a cathode (a reflective electrode), a light emitted from the EL element transmits an anode made of a transparent conductive film, and the light is emerged on a side of a substrate formed by TFTs. Another structure in which the EL element is formed in order of a cathode (a reflective electrode), an EL layer (an electron injection layer, an electron transporting layer, a light emitting layer, a hole transporting layer, a hole injection layer), and an anode (a transparent electrode), the light is emerged on the opposite side of the first case, can be used. Still another structure in which the light transmits a side of a cathode may also be adopted.

In addition, this embodiment can be conducted by freely combining the other embodiments.

Embodiment 11

In this embodiment, an external light emitting quantum efficiency can be remarkably improved by using an organic light emitting material by which phosphorescence from a triplet excitation can be employed for emitting a light. As a result, the power consumption of light emitting element can be reduced, the lifetime of light emitting element can be elongated and the weight of light emitting element can be lightened.

The following is a report where the external light emitting quantum efficiency is improved by using the triplet excitation (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.

(Chemical formula 1)

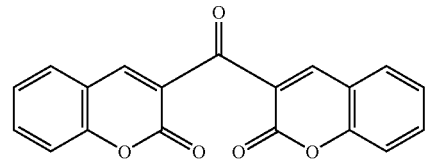

(M. A. Baldo, D. F. O'Brien, Y. You, A. Shoustikov, S. Sibley, M. E. Thompson, S. R. Forrest, Nature 395 (1998) p.151)

The molecular formula of an organic light emitting material (Pt complex) reported by the above article is represented as follows.

(Chemical formula 2)

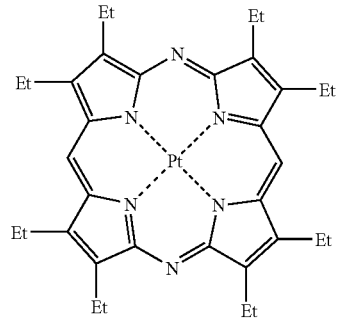

(M. A. Baldo, S. Lamansky, P. E. Burrows, M. E. Thompson, S. R. Forrest, Appl. Phys. Lett., 75 (1999) p.4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an organic light emitting material (Ir complex) reported by the above article is represented as follows.

(Chemical formula 3)

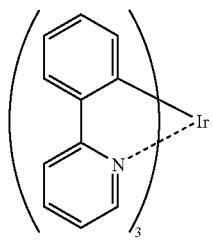

As described above, if phosphorescence from a triplet excitation can be put to practical use, it can realize the external light emitting quantum efficiency three to four times as high as that in the case of using fluorescence from a singlet excitation in principle.

In addition, this embodiment can be carried out by combining the other embodiments.

Embodiment 12

Examples of such electronic apparatuses manufactured by applying the present invention include a video camera, a digital camera, a goggles-type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction device including a recording medium (more specifically, an device which can reproduce a recording medium such as a digital versatile disc (DVD) and so forth, and includes a display for displaying the reproduced image), or the like. In particular, in the case of the portable information terminal, use of the light emitting device is preferable, since the portable information terminal that is likely to be viewed from a tilted direction is often required to have a wide viewing angle. FIGS. 22A to 22H respectively show various specific examples of such electronic apparatuses.

Figure 22A:
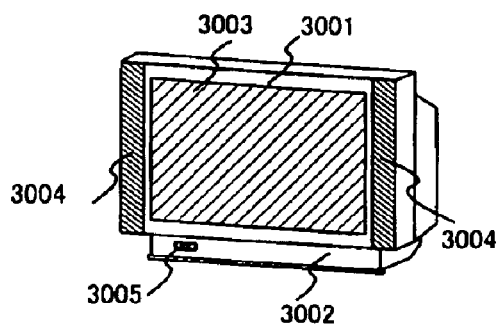
FIGS. 22A to 22H are diagrams showing examples of electronic equipment to which a semiconductor device manufactured in accordance with the present invention can be applied.

FIG. 22A illustrates an light emitting element display device which includes a casing 3001, a support table 3002, a display portion 3003, a speaker portion 3004, a video input terminal 3005 or the like. The present invention is applicable to the display portion 3003. The light emitting device is of the self-emission-type and therefore requires no backlight. Thus, the display portion thereof can have a thickness thinner than that of a liquid crystal display device. The light emitting display device is including the entire display device for displaying information, such as a personal computer, a receiver of TV broadcasting and an advertising display.

Figure 22B:
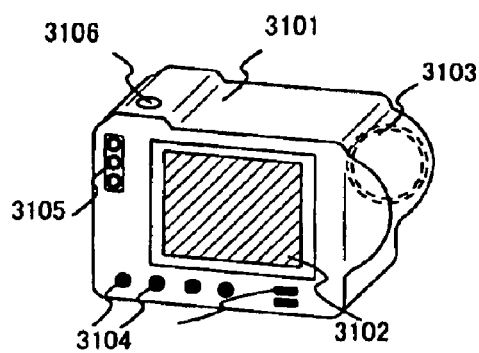

FIG. 22B illustrates a digital still camera which includes a main body 3101, a display portion 3102, an image receiving portion 3103, an operation key 3104, an external connection port 3105, a shutter 3106, or the like. The present invention can be used for manufacturing the display portion 3102.

Figure 22C:
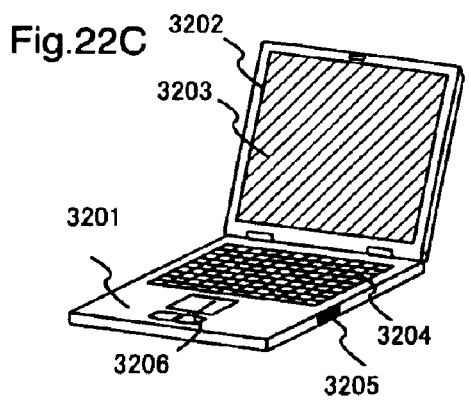

FIG. 22C illustrates a lap-top computer which includes a main body 3201, a casing 3202, a display portion 3203, a keyboard 3204, an external connection port 3205, a pointing mouse 3206, or the like. The present invention can be used for manufacturing the display portion 3203.

Figure 22D:
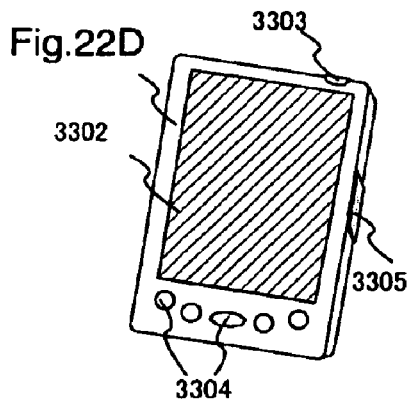

FIG. 22D illustrated a mobile computer which includes a main body 3301, a display portion 3302, a switch 3033, an operation key 3304, an infrared port 3305, or the like. The present invention can be used for manufacturing the display portion 3302.

Figure 22E:
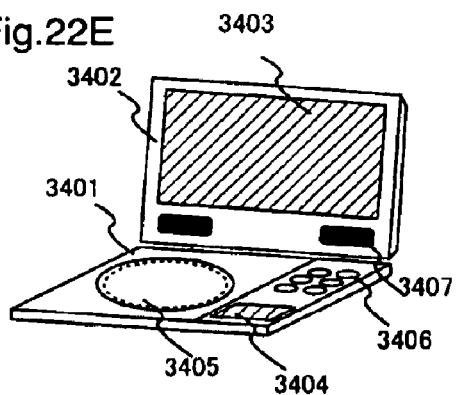

FIG. 22E illustrates a portable image reproduction device including a recording medium (more specifically, a DVD reproduction device), which includes a main body 3401, a casing 3402, a display portion A 3403, another display portion B 3404, a recording medium (DVD or the like) reading portion 3405, an operation key 3406, a speaker portion 3407 or the like. The display portion A 3403 is used mainly for displaying image information, while the display portion B 3404 is used mainly for displaying character information. The present invention can be used for manufacturing these display portions A 3403 and B 3404. The image reproduction device including a recording medium further includes a game machine or the like.

Figure 22F:
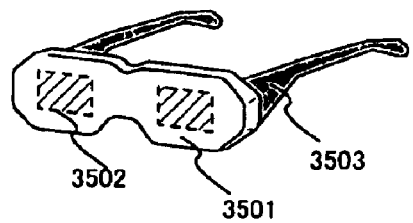

FIG. 22F illustrates a goggle type display (head mounted display) which includes a main body 3501, a display portion 3502, arm portion 3503 or the like. The present invention can be used for manufacturing the display portion 3502.

Figure 22G:
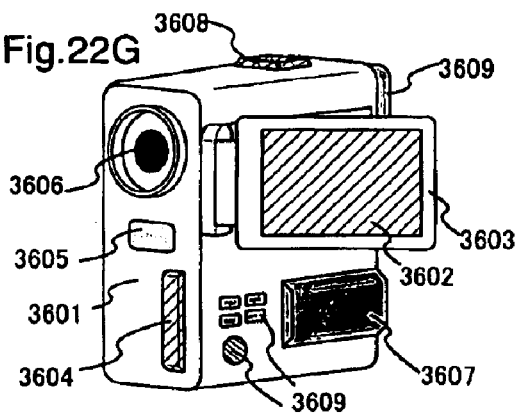

FIG. 22G illustrates a video camera which includes a main body 3601, a display portion 3602, a casing 3603, an external connecting port 3604, a remote control receiving portion 3605, an image receiving portion 3606, a battery 3607, a sound input portion 3608, an operation key 3609, or the like. The present invention can be used for manufacturing the display portion 3602.

Figure 22H:
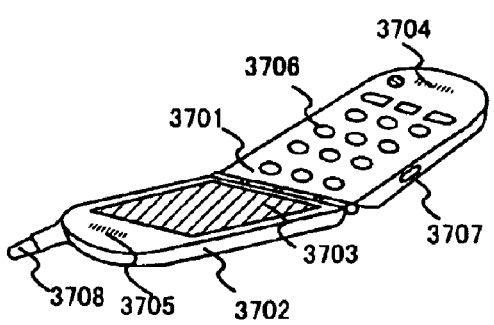

FIG. 22H illustrates a mobile phone which includes a main body 3701, a casing 3702, a display portion 3703, a sound input portion 3704, a sound output portion 3705, an operation key 3706, an external connecting port 3707, an antenna 3708, or the like. Note that the display portion 3703 can reduce power consumption of the mobile telephone by displaying white-colored characters on a black-colored background. The present invention can be used for manufacturing the display portion 3703.

When a brighter luminance of light emitted from the organic light emitting material becomes available in the future, the light emitting device in accordance with the present invention will be applicable to a front-type or rear-type projector in which light including output image information is enlarged by means of lenses or the like to be projected.

The aforementioned electronic apparatuses are more likely to be used for display information distributed through a telecommunication path such as Internet, a CATV (cable television system), and in particular likely to display moving picture information. The light emitting device is suitable for displaying moving pictures since the organic light emitting material can exhibit high response speed.

A portion of the light emitting device that is emitting light consumes power, so it is desirable to display information in such a manner that the light emitting portion therein becomes as small as possible. Accordingly, when the light emitting device is applied to a display portion which mainly displays character information, e.g., a display portion of a portable information terminal, and more particular, a portable telephone or a sound reproduction device, it is desirable to drive the light emitting device so that the character information is formed by a light emitting portion while a non-emission portion corresponds to the background.

According to the present invention, only portions having excellent characteristics are chosen from a crystalline semiconductor layer crystallized by a CW laser to obtain large grain sizes and are efficiently used' to form TFTs and circuits. This way the present invention makes it possible to manufacture a highly reliable semiconductor device which can operate at high speed and which is less fluctuated in characteristic.

What is claimed is:

1. A method of manufacturing a thin film transistor, comprising:

forming an amorphous semiconductor film over a substrate;

running a laser beam relative to the substrate to irradiate the amorphous semiconductor film with the laser beam and form a crystalline semiconductor film; and etching the crystalline semiconductor film to form an active layer, wherein the width of a region irradiated with the laser beam is the sum of an effective irradiation region width D, a width d of a region on the left side of the effective irradiation region, and a width d of a region on the right side of the effective irradiation region, and wherein the crystalline semiconductor film used for the active layer is formed excluding a region within a distance L, which is expressed by $n(D+2d)-d \leq L \leq n(D+2d)+d$ and $0 \leq L$ (n is an integer, $0 \leq n$) when V=0, V being the overlap width of adjacent laser beams during laser beam scanning, L being the distance from the origin in the direction perpendicular to the laser beam scanning direction, the origin being one point in an end of the region irradiated with the laser beam on an irradiation object.

2. A method of manufacturing a thin film transistor according to claim 1, wherein the laser beam is emitted from a continuous wave solid-state laser or a continuous wave gas laser or a continuous wave metal steam laser.

3. A method of manufacturing a thin film transistor according claim 1, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

4. A method of manufacturing a thin film transistor according to claim 1, wherein the laser beam is emitted from one selected from the group consisting of a continuous wave excimer laser, a continuous wave Ar laser, a continuous wave Kr laser, and a continuous wave $CO_2$ laser.

5. A method of manufacturing a thin film transistor according to claim 1, wherein the laser beam is emitted from one selected from the group consisting of a continuous wave helium cadmium laser, a continuous wave copper steam laser, and a continuous wave gold steam laser.

6. A method of manufacturing a thin film transistor according to claim 1, wherein the laser beam is collected to an elliptical or rectangular shape before the running step.

7. A method of manufacturing a thin film transistor according to claim 1, wherein the laser beam is a continuous wave.

8. A method of manufacturing a thin film transistor, comprising:
   forming an amorphous semiconductor film over a substrate;
   running a laser beam relative to the substrate to irradiate the amorphous semiconductor film with the laser beam and form a crystalline semiconductor film; and
   etching the crystalline semiconductor film to form an active layer,
   wherein the width of a region irradiated with the laser beam is the sum of an effective irradiation region width D, a width d of a region on the left side of the effective irradiation region, and a width d of a region on the right side of the effective irradiation region, and
   wherein the crystalline semiconductor film used for the active layer is formed excluding a region within a distance L, which is expressed by $n(D+2d)-d-(n-1)V \leq L \leq n(D+2d)+d-nV$ and $0 \leq L$ (n is an integer, $0 \leq n$) when $0 \leq V \leq d$, V being the overlap width of adjacent laser beams during laser beam scanning, L being the distance from the origin in the direction perpendicular to the laser beam scanning direction, the origin being one point in an end of the region irradiated with the laser beam on an irradiation object.

9. A method of manufacturing a thin film transistor according to claim 8, wherein the laser beam is emitted from a continuous wave solid-state laser or a continuous wave gas laser or a continuous wave metal steam laser.

10. A method of manufacturing a thin film transistor according to claim 8, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

11. A method of manufacturing a thin film transistor according to claim 8, wherein the laser beam is emitted from one selected from the group consisting of a continuous wave excimer laser, a continuous wave Ar laser, a continuous wave Kr laser, and a continuous wave $CO_2$ laser.

12. A method of manufacturing a thin film transistor according to claim 8, wherein the laser beam is emitted from one selected from the group consisting of a continuous wave helium cadmium laser, a continuous wave copper steam laser, and a continuous wave gold steam laser.

13. A method of manufacturing a thin film transistor according to claim 8, wherein the laser beam is collected to an elliptical or rectangular shape before the running step.

14. A method of manufacturing a thin film transistor according to claim 8, wherein the laser beam is a continuous wave.

15. A method of manufacturing a thin film transistor, comprising:
   forming an amorphous semiconductor film over a substrate;
   running a laser beam relative to the substrate to irradiate the amorphous semiconductor film with the laser beam and form a crystalline semiconductor film; and
   etching the crystalline semiconductor film to form an active layer,
   wherein the width of a region irradiated with the laser beam is the sum of an effective irradiation region width D, a width d of a region on the left side of the effective irradiation region, and a width d of a region on the right side of the effective irradiation region, and
   wherein the crystalline semiconductor film used for the active layer is formed excluding a region within a distance L, which is expressed by $n(D+V)-V+d \leq L \leq n(D+V)+d$ and $0 \leq L$ (n is an integer, $0 \leq n$) when $d<V$, V being the overlap width of adjacent laser beams during laser beam scanning, L being the distance from the origin in the direction perpendicular to the laser beam scanning direction, the origin being one point in an end of the region irradiated with the laser beam on an irradiation object.

16. A method of manufacturing a thin film transistor according to claim 15, wherein the laser beam is emitted from a continuous wave solid-state laser or a continuous wave gas laser or a continuous wave metal steam laser.

17. A method of manufacturing a thin film transistor according claim 15, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

18. A method of manufacturing a thin film transistor according to claim 15, wherein the laser beam is emitted from one selected from the group consisting of a continuous wave excimer laser, a continuous wave Ar laser, a continuous wave Kr laser, and a continuous wave $CO_2$ laser.

19. A method of manufacturing a thin film transistor according to claim 15, wherein the laser beam is emitted from one selected from the group consisting of a continuous wave helium cadmium laser, a continuous wave copper steam laser, and a continuous wave gold steam laser.

20. A method of manufacturing a thin film transistor according to claim 15, wherein the laser beam is collected to an elliptical or rectangular shape before the running step.

21. A method of manufacturing a thin film transistor according to claim 15, wherein the laser beam is a continuous wave.

22. A method of manufacturing a thin film transistor, comprising:
    forming an amorphous semiconductor film over a substrate;
    running a laser beam relative to the substrate to irradiate the amorphous semiconductor film with the laser beam and form a crystalline semiconductor film; and
    etching the crystalline semiconductor film to form an active layer,
    wherein the width of a region irradiated with the laser beam is the sum of an effective irradiation region width D, a width d of a region on the left side of the effective irradiation region, and a width d of a region on the right side of the effective irradiation region, and
    wherein the crystalline semiconductor film used for the active layer is formed excluding a region within a distance L, which is expressed by $n(D+2d)-d+(n-1)F \leq L \leq n(D+2d)+d+nF$ and $0 \leq L$ (n is an integer, $0 \leq n$), (F is a offset, $F=|-V|$) when $V<0$, V being the overlap width of adjacent laser beams during laser beam scanning, L being the distance from the origin in the direction perpendicular to the laser beam scanning direction, the origin being one point in an end of the region irradiated with the laser beam on an irradiation object.

23. A method of manufacturing a thin film transistor according to claim 22, wherein the laser beam is emitted from a continuous wave solid-state laser or a continuous wave gas laser or a continuous wave metal steam laser.

24. A method of manufacturing a thin film transistor according claim 22, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

25. A method of manufacturing a thin film transistor according to claim 22, wherein the laser beam is emitted from one selected from the group consisting of a continuous wave excimer laser, a continuous wave Ar laser, a continuous wave Kr laser, and a continuous wave $CO_2$ laser.

26. A method of manufacturing a thin film transistor according to claim 22, wherein the laser beam is emitted from one selected from the group consisting of a continuous wave helium cadmium laser, a continuous wave copper steam laser, and a continuous wave gold steam laser.

27. A method of manufacturing a thin film transistor according to claim 22, wherein the laser beam is collected to an elliptical or rectangular shape before the running step.

28. A method of manufacturing a thin film transistor according to claim 22, wherein the laser beam is a continuous wave.

29. A method of manufacturing a thin film transistor, comprising:
    forming an amorphous semiconductor film over a substrate;
    subjecting the amorphous semiconductor film to heat treatment to form a first crystalline semiconductor film;
    running a laser beam relative to the substrate to irradiate the first crystalline semiconductor film with the laser beam and form a second crystalline semiconductor film; and
    etching the second crystalline semiconductor film to form an active layer,
    wherein the width of a region irradiated with the laser beam is the sum of an effective irradiation region width D, a width d of a region on the left side of the effective irradiation region, and a width d of a region on the right side of the effective irradiation region, and
    wherein the second crystalline semiconductor film used for the active layer is formed excluding a region within a distance L, which is expressed by $n(D+2d)-d \leq L \leq n(D+2d)+d$ and $0 \leq L$ (n is an integer, $0 \leq n$) when $V=0$, V being the overlap width of adjacent laser beams during laser beam scanning, L being the distance from the origin in the direction perpendicular to the laser beam scanning direction, the origin being one point in an end of the region irradiated with the laser beam on an irradiation object.

30. A method of manufacturing a thin film transistor according to claim 29, wherein the laser beam is emitted from a continuous wave solid-state laser or a continuous wave gas laser or a continuous wave metal steam laser.

31. A method of manufacturing a thin film transistor according claim 29, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

32. A method of manufacturing a thin film transistor according to claim 29, wherein the laser beam is emitted from one selected from the group consisting of a continuous wave excimer laser, a continuous wave Ar laser, a continuous wave Kr laser, and a continuous wave $CO_2$ laser.

33. A method of manufacturing a thin film transistor according to claim 29, wherein the laser beam is emitted from one selected from the group consisting of a continuous wave helium cadmium laser, a continuous wave copper steam laser, and a continuous wave gold steam laser.

34. A method of manufacturing a thin film transistor according to claim 29, wherein the laser beam is collected to an elliptical or rectangular shape before the running step.

35. A method of manufacturing a thin film transistor according to claim 29, wherein the laser beam is a continuous wave.

36. A method of manufacturing a thin film transistor, comprising:
    forming an amorphous semiconductor film over a substrate;
    subjecting the amorphous semiconductor film to heat treatment to form a first crystalline semiconductor film;
    running a laser beam relative to the substrate to irradiate the first crystalline semiconductor film with the laser beam and form a second crystalline semiconductor film; and
    etching the second crystalline semiconductor film to form an active layer,
    wherein the width of a region irradiated with the laser beam is the sum of an effective irradiation region width D, a width d of a region on the left side of the effective irradiation region, and a width d of a region on the right side of the effective irradiation region, and
    wherein the second crystalline semiconductor film used for the active layer is formed excluding a region within a distance L, which is expressed by $n(D+2d)-d-(n-1)V \leq L \leq n(D+2d)+d-nV$ and $0 \leq L$ (n is an integer, $0 \leq n$) when $0<V \leq d$, V being the overlap width of adjacent laser beams during laser beam scanning, L being the distance from the origin in the direction perpendicular to the laser beam scanning direction, the origin being one point in an end of the region irradiated with the laser beam on an irradiation object.

37. A method of manufacturing a thin film transistor according to claim 36, wherein the laser beam is emitted from a continuous wave solid-state laser or a continuous wave gas laser or a continuous wave metal steam laser.

38. A method of manufacturing a thin film transistor according claim 36, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

39. A method of manufacturing a thin film transistor according to claim 36, wherein the laser beam is emitted from one selected from the group consisting of a continuous wave excimer laser, a continuous wave Ar laser, a continuous wave Kr laser, and a continuous wave $CO_2$ laser.

40. A method of manufacturing a thin film transistor according to claim 36, wherein the laser beam is emitted from one selected from the group consisting of a continuous wave helium cadmium laser, a continuous wave copper steam laser, and a continuous wave gold steam laser.

41. A method of manufacturing a thin film transistor according to claim 36, wherein the laser beam is collected to an elliptical or rectangular shape before the running step.

42. A method of manufacturing a thin film transistor according to claim 36, wherein the laser beam is a continuous wave.

43. A method of manufacturing a thin film transistor, comprising:
forming an amorphous semiconductor film over a substrate;
subjecting the amorphous semiconductor film to heat treatment to form a first crystalline semiconductor film;
running a laser beam relative to the substrate to irradiate the first crystalline semiconductor film with the laser beam and form a second crystalline semiconductor film; and
etching the second crystalline semiconductor film to form an active layer,
wherein the width of a region irradiated with the laser beam is the sum of an effective irradiation region width D, a width d of a region on the left side of the effective irradiation region, and a width d of a region on the right side of the effective irradiation region, and
wherein the second crystalline semiconductor film used for the active layer is formed excluding a region within a distance L, which is expressed by $n(D+V)-V+d \leq L \leq n(D+V)+d$ and $0 \leq L$ (n is an integer, $0 \leq n$) when d<V, V being the overlap width of adjacent laser beams during laser beam scanning, L being the distance from the origin in the direction perpendicular to the laser beam scanning direction, the origin being one point in an end of the region irradiated with the laser beam on an irradiation object.

44. A method of manufacturing a thin film transistor according to claim 43, wherein the laser beam is emitted from a continuous wave solid-state laser or a continuous wave gas laser or a continuous wave metal steam laser.

45. A method of manufacturing a thin film transistor according claim 43, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

46. A method of manufacturing a thin film transistor according to claim 43, wherein the laser beam is emitted from one selected from the group consisting of a continuous wave excimer laser, a continuous wave Ar laser, a continuous wave Kr laser, and a continuous wave $CO_2$ laser.

47. A method of manufacturing a thin film transistor according to claim 43, wherein the laser beam is emitted from one selected from the group consisting of a continuous wave helium cadmium laser, a continuous wave copper steam laser, and a continuous wave gold steam laser.

48. A method of manufacturing a thin film transistor according to claim 43, wherein the laser beam is collected to an elliptical or rectangular shape before the running step.

49. A method of manufacturing a thin film transistor according to claim 43, wherein the laser beam is a continuous wave.

50. A method of manufacturing a thin film transistor, comprising:
forming an amorphous semiconductor film over a substrate;
subjecting the amorphous semiconductor film to heat treatment to form a first crystalline semiconductor film;
running a laser beam relative to the substrate to irradiate the first crystalline semiconductor film with the laser beam and form a second crystalline semiconductor film; and
etching the second crystalline semiconductor film to form an active layer,
wherein the width of a region irradiated with the laser beam is the sum of an effective irradiation region width D, a width d of a region on the left side of the effective irradiation region, and a width d of a region on the right side of the effective irradiation region, and
wherein the second crystalline semiconductor film used for the active layer is formed excluding a region within a distance L, which is expressed by $n(D+2d)-d+(n-1)F \leq L \leq n(D+2d)+d+nF$ and $0 \leq L$ (n is an integer, $0 \leq n$), (F is a offset, $F=|-V|$) when V<0, V being the overlap width of adjacent laser beams during laser beam scanning, L being the distance from the origin in the direction perpendicular to the laser beam scanning direction, the origin being one point in an end of the region irradiated with the laser beam on an irradiation object.

51. A method of manufacturing a thin film transistor according to claim 50, wherein the laser beam is emitted from a continuous wave solid-state laser or a continuous wave gas laser or a continuous wave metal steam laser.

52. A method of manufacturing a thin film transistor according claim 50, wherein the laser beam is emitted from one selected from the group consisting of a continuous wave YAG laser, a continuous wave $YVO_4$ laser, a continuous wave YLF laser, a continuous wave $YAlO_3$ laser, a continuous wave alexandrite laser, and a continuous wave Ti:sapphire laser.

53. A method of manufacturing a thin film transistor according to claim 50, wherein the laser beam is emitted from one selected from the group consisting of a continuous wave excimer laser, a continuous wave Ar laser, a continuous wave Kr laser, and a continuous wave $CO_2$ laser.

54. A method of manufacturing a thin film transistor according to claim 50, wherein the laser beam is emitted from one selected from the group consisting of a continuous wave helium cadmium laser, a continuous wave copper steam laser, and a continuous wave gold steam laser.

55. A method of manufacturing a thin film transistor according to claim 50, wherein the laser beam is collected to an elliptical or rectangular shape before the running step.

56. A method of manufacturing a thin film transistor according to claim 50, wherein the laser beam is a continuous wave.

57. A method of manufacturing a thin film transistor, comprising:
   forming an amorphous semiconductor film over a substrate;
   forming a first alignment marker on the amorphous semiconductor film;
   running a laser beam that is collected relative to the substrate to irradiate the amorphous semiconductor film with the laser beam and form a crystalline semiconductor film;
   placing a mask that has a second alignment marker formed to coincide with the first alignment marker on the crystalline semiconductor film; and
   etching the crystalline semiconductor film to form an active layer,
   wherein the laser beam irradiation is started from an arbitrary point determined with the first alignment marker as the reference.

58. A method of manufacturing a thin film transistor according to claim 57, wherein the position for forming the first and second alignment markers is determined by the position of the active layer and the laser beam scanning pitch.

59. A method of manufacturing a thin film transistor according to claim 57, wherein more than one pair of the first and second alignment markers are formed.

60. A method of manufacturing a thin film transistor according to claim 57, wherein the laser beam is emitted from a continuous wave solid-state laser or a continuous wave gas laser or a continuous wave metal steam laser.

61. A method of manufacturing a thin film transistor according claim 57, wherein the laser beam is emitted from one selected from the group consisting of a continuous wave YAG laser, a continuous wave $YVO_4$ laser, a continuous wave YLF laser, a a continuous wave $YAlO_3$ laser, a continuous wave alexandrite laser, and a continuous wave Ti:sapphire laser.

62. A method of manufacturing a thin film transistor according to claim 57, wherein the laser beam is emitted from one selected from the group consisting of a continuous wave excimer laser, a continuous wave Ar laser, a continuous wave Kr laser, and a continuous wave $CO_2$ laser.

63. A method of manufacturing a thin film transistor according to claim 57, wherein the laser beam is emitted from one selected from the group consisting of a continuous wave helium cadmium laser, a continuous wave copper steam laser, and a continuous wave gold steam laser.

64. A method of manufacturing a thin film transistor according to claim 57, wherein the laser beam is collected to an elliptical or rectangular shape before the running step.

65. A method of manufacturing a thin film transistor according to claim 57, wherein the laser beam is a continuous wave.

66. A method of manufacturing a semiconductor device comprising:
   forming an amorphous semiconductor film over a substrate;
   scanning a first irradiation area of the amorphous semiconductor film with a laser beam to crystallize the first irradiation area of the amorphous semiconductor film wherein the first irradiation area has an elongated shape extending in one direction, and the first irradiation area has an effective irradiation region extending along the one direction and a pair of second regions between the effective irradiation region and both side edges of the first irradiation area;
   forming at least one semiconductor island by patterning the crystallized semiconductor film wherein the at least one semiconductor island is located in the effective irradiation region, wherein the semiconductor island is not located in the pair of second regions; and
   wherein the width of a region irradiated with the laser beam is the sum of the effective irradiation region width D, a width d of a region on the left side of the effective irradiation region, and a width d of a region on the right side of the effective irradiation region, and
   wherein the semiconductor island used for the active layer is formed excluding a region within a distance L, which is expressed by $n(D+2d)-d-(n-1) V \leq L \leq n (D+2d)+d-nV$ and $0 \leq L$ (n is an integer, $0 \leq n$) when $0 < V \leq d$ V being the overlap width of adjacent laser beams during laser beam scanning, L being the distance from the origin in the direction perpendicular to the laser beam scanning direction, the origin being one point in an end of the region irradiated with the laser beam on an irradiation object.

67. A method of manufacturing a thin film transistor according to claim 66, wherein the laser beam is collected to an elliptical or rectangular shape before the scanning step.

68. A method of manufacturing a thin film transistor according to claim 66, wherein the laser beam is a continuous wave.

69. A method of manufacturing a semiconductor device comprising:
   forming an amorphous semiconductor film over a substrate;
   scanning a first irradiation area of the amorphous semiconductor film with a laser beam to crystallize the first irradiation area of the amorphous semiconductor film wherein the first irradiation area has an elongated shape extending in one direction, and the first irradiation area has an effective irradiation region extending along the one direction and a pair of second regions between the effective irradiation region and both side edges of the first irradiation area;
   forming at least one semiconductor island by patterning the crystallized semiconductor film wherein the at least one semiconductor island is located in the effective irradiation region; and
   wherein the width of a region irradiated with the laser beam is the sum of the effective irradiation region width D, a width d of a region on the left side of the effective irradiation region, and a width d of a region on the right side of the effective irradiation region, and
   wherein the semiconductor island used for the active layer is formed excluding a region within a distance L, which is expressed by $n(D+2d)-d-(n-1) V \leq L \leq n (D+2d)+d-nV$ and $0 \leq L$ (n is an integer, $0 \leq n$) when $0 < V \leq d$, V being the overlap width of adjacent laser beams during laser beam scanning, L being the distance from the origin in the direction perpendicular to the laser beam scanning direction, the origin being one point in an end of the region irradiated with the laser beam on an irradiation object.

70. A method of manufacturing a thin film transistor according to claim 69, wherein the laser beam is collected to an elliptical or rectangular shape before the scanning step.

71. A method of manufacturing a thin film transistor according to claim 69, wherein the laser beam is a continuous wave.

* * * * *